(12) United States Patent
Ahn et al.

(10) Patent No.: US 7,205,571 B2
(45) Date of Patent: Apr. 17, 2007

(54) THIN FILM TRANSISTOR SUBSTRATE FOR DISPLAY DEVICE AND FABRICATING METHOD THEREOF

(75) Inventors: Byung Chul Ahn, Ahnyang-si (KR); Soon Sung Yoo, Gunpo-si (KR); Heung Lyul Cho, Suwon-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 135 days.

(21) Appl. No.: 10/963,599

(22) Filed: Oct. 14, 2004

(65) Prior Publication Data
US 2005/0077523 A1    Apr. 14, 2005

(30) Foreign Application Priority Data
Oct. 14, 2003 (KR) ............... 10-2003-0071504

(51) Int. Cl.
*H01L 29/15* (2006.01)
*G02F 1/1365* (2006.01)

(52) U.S. Cl. ............... 257/72; 257/59; 257/71; 257/E29.273; 438/149; 438/155; 349/43; 435/92

(58) Field of Classification Search ............... 257/72, 257/49, 59, 71; 438/145–166; 349/39, 42, 349/43; 345/92
See application file for complete search history.

(56) References Cited

U.S. PATENT DOCUMENTS

| | | | | |
|---|---|---|---|---|
| 2002/0008798 A1* | 1/2002 | Song et al. | ............ | 349/43 |
| 2003/0197182 A1* | 10/2003 | Kim et al. | ............ | 257/72 |
| 2004/0263722 A1* | 12/2004 | Oh et al. | ............ | 349/106 |
| 2005/0077522 A1* | 4/2005 | Chang et al. | ............ | 257/72 |

* cited by examiner

*Primary Examiner*—Thao X. Le
*Assistant Examiner*—Abul Kalam
(74) *Attorney, Agent, or Firm*—McKenna Long & Aldridge LLP

(57) ABSTRACT

A thin film transistor (TFT) substrate is fabricated in three mask processes. In a first mask process, a gate line and a gate electrode are formed. In a second mask process, a data line, a source electrode, a drain electrode, a semiconductor layer, and a first upper storage electrode overlapping the gate line are formed from a gate insulating film, undoped and doped amorphous silicon layers, and a data metal layer. In a third mask process, a pixel hole is formed through protective and gate insulating films within and outside a pixel area, the first upper storage electrode is partially removed, a pixel electrode contacts a side of the drain electrode within the pixel hole at the pixel area, and a second upper storage electrode contacts a side of the first upper storage electrode in the pixel hole outside the pixel area.

7 Claims, 24 Drawing Sheets

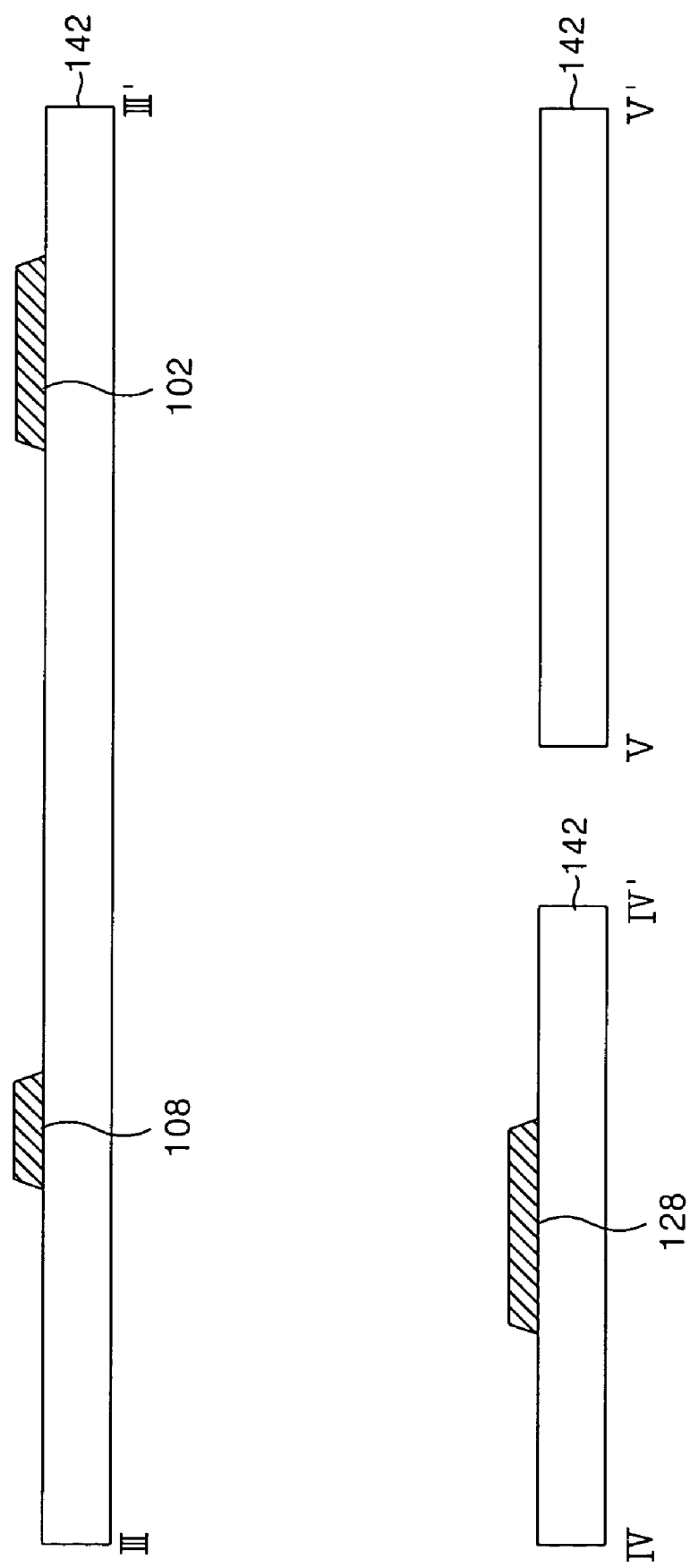

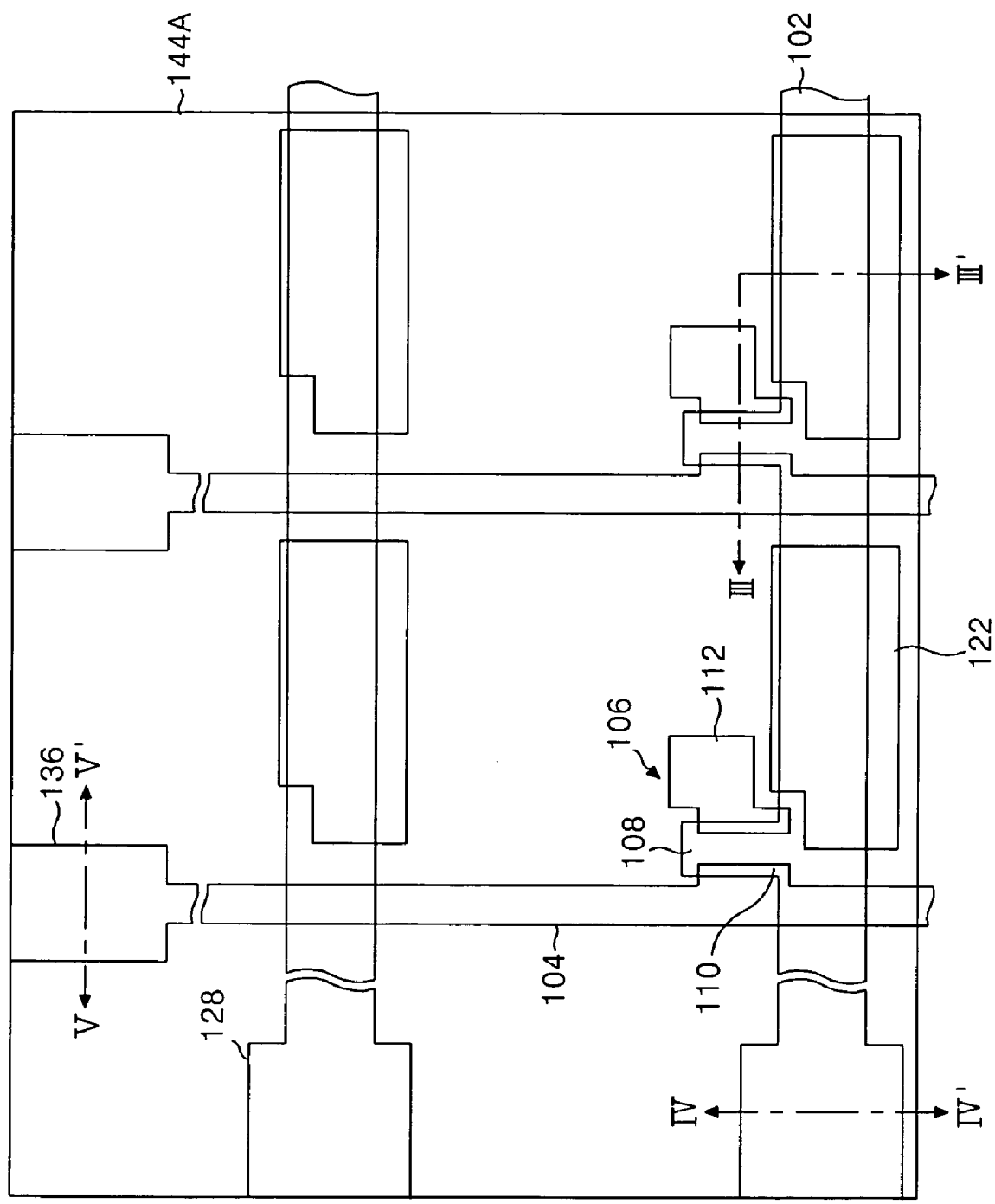

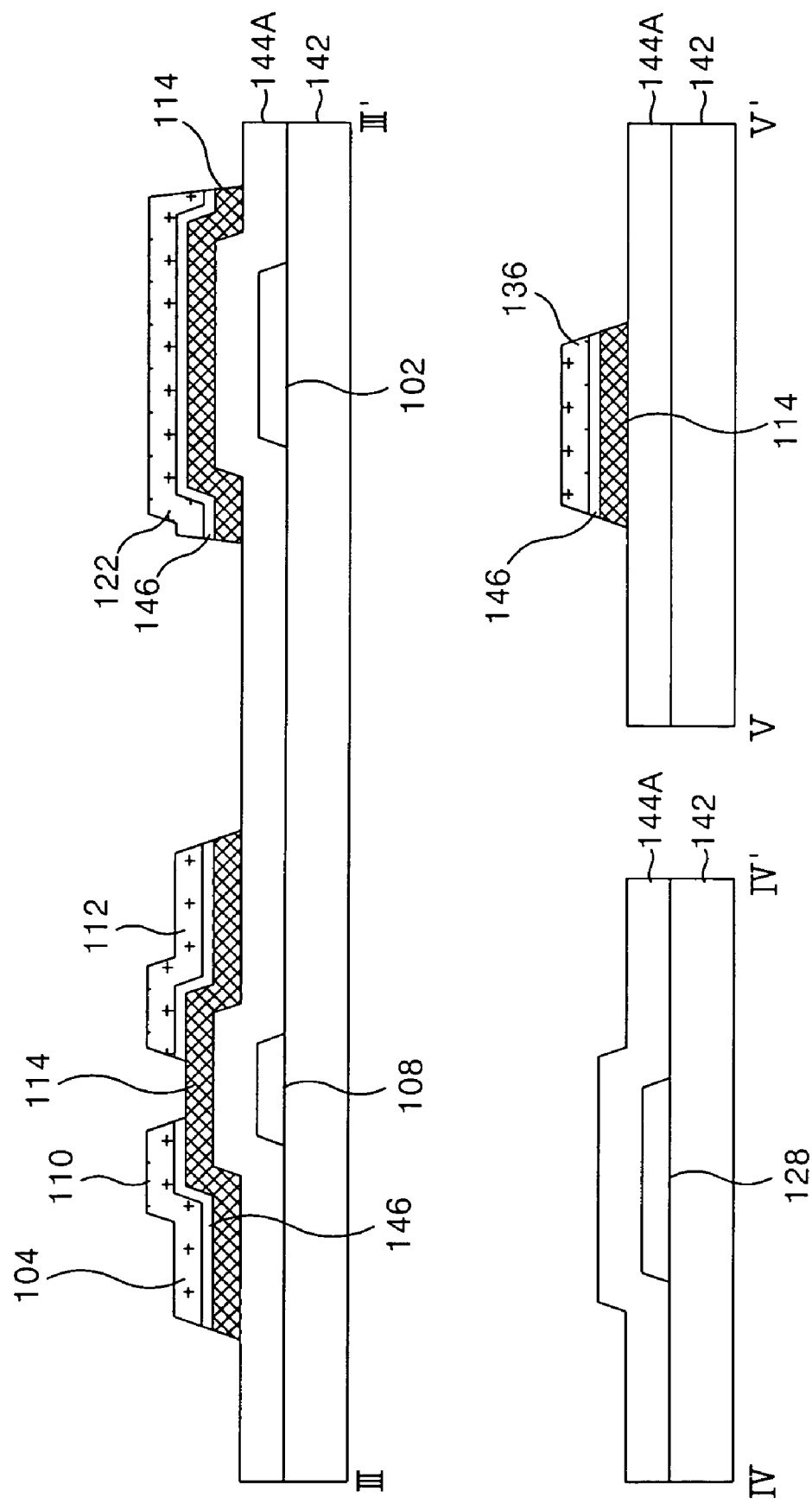

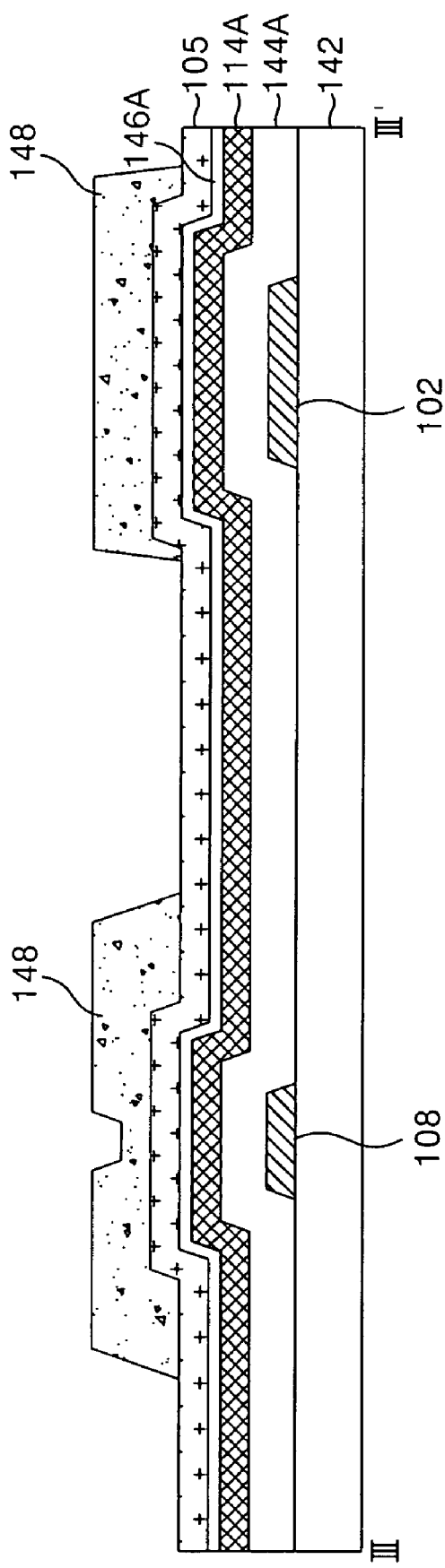
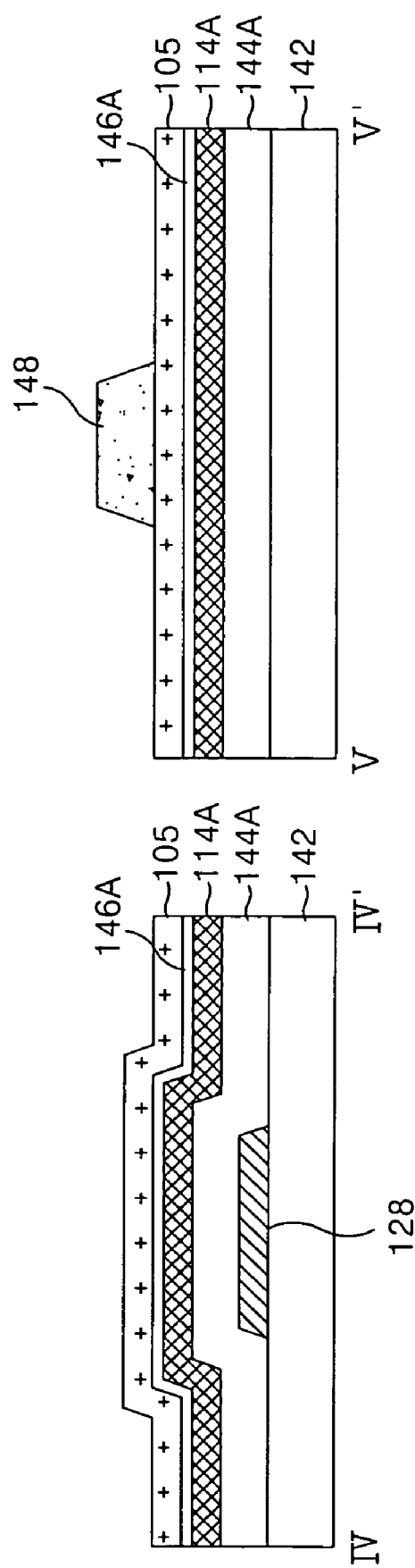
FIG.10A

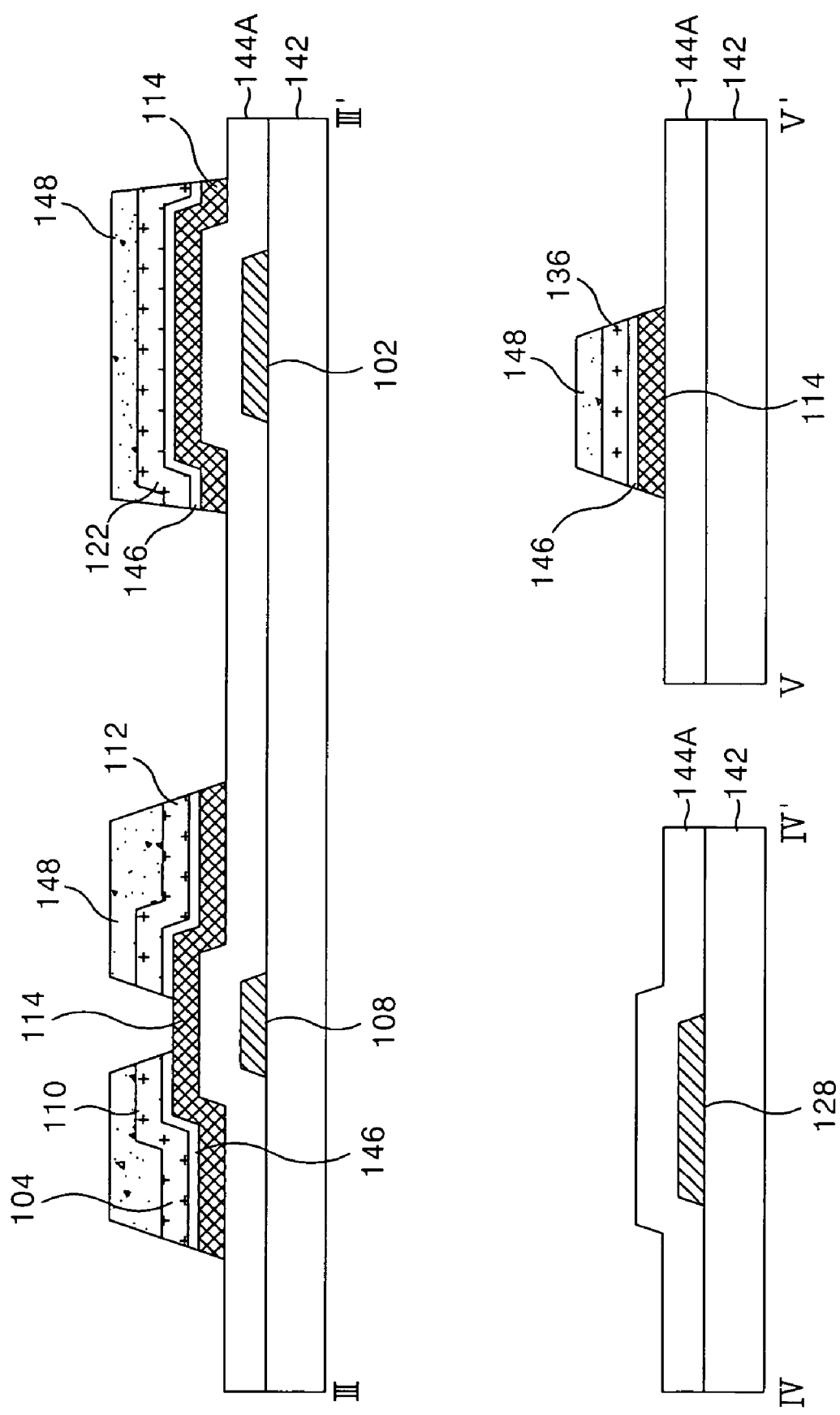

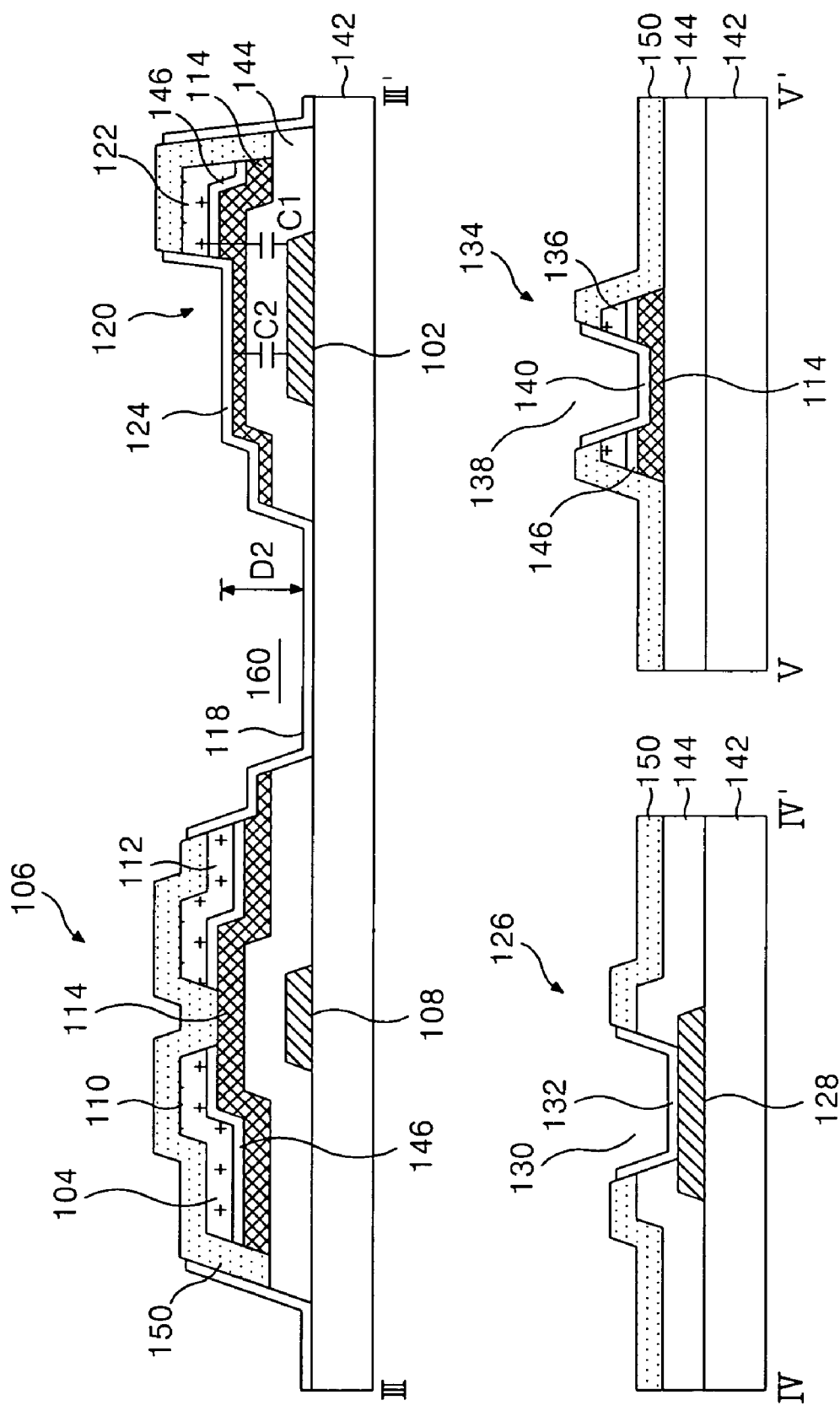

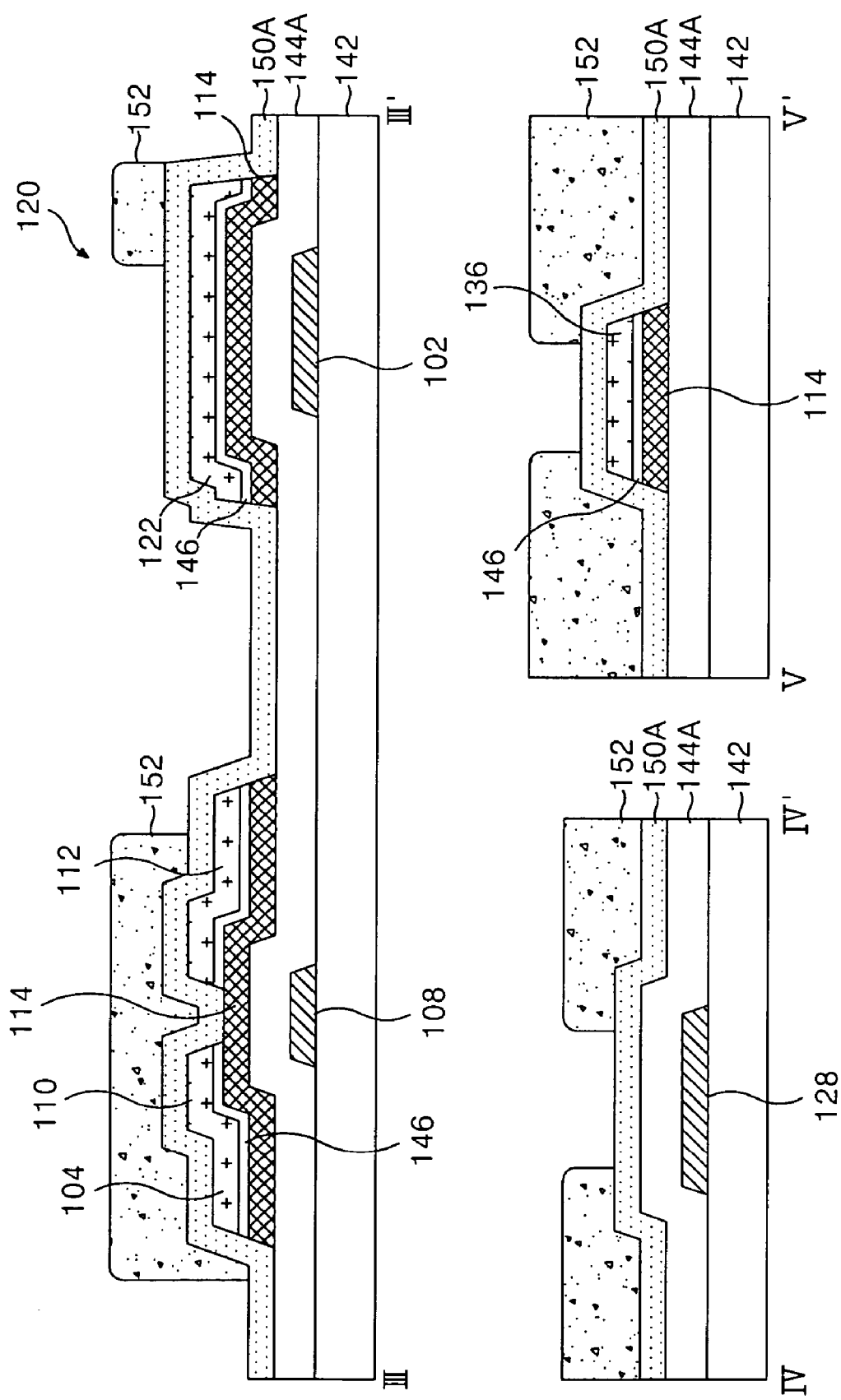

THIN FILM TRANSISTOR SUBSTRATE FOR DISPLAY DEVICE AND FABRICATING METHOD THEREOF

This application claims the benefit of Korean Patent Application No. P2003-71504, filed on Oct. 14, 2003, which is hereby incorporated by reference for all purposes as if fully set forth herein.

BACKGROUND OF THE INVENTION

1. Field of the Invention

The present invention relates to a liquid crystal display (LCD) device. More particularly, the present invention relates to a thin film transistor (TFT) substrate for an LCD device and a method of fabricating the same using a reduced number of mask processes.

2. Discussion of the Related Art

Liquid crystal display (LCD) devices express pictures by selectively altering light transmittance characteristics of liquid crystal material within an LCD panel having a plurality of pixels arranged in a matrix. Light transmittance characteristics of the liquid crystal material can be selectively altered with a driving circuit that controls the generation of an electric field through the liquid crystal material (i.e., driving the liquid crystal material).

LCD panels generally include a TFT substrate joined to, and separated from, a color filter substrate to form a cell gap. Spacers are distributed within the cell gap to uniformly maintain the distance between the TFT array and color filter substrates and liquid crystal material is arranged within the cell gap containing the spacers.

The TFT substrate typically includes gate lines, data lines crossing the gate lines to define pixel areas, switching devices (i.e., TFTs) at the crossings of the gate and data lines, pixel electrodes in each pixel area and connected to each TFT, and an alignment film coated thereon. The gate and data lines receive signals from driving circuits via corresponding pad portions. In response to scanning signals transmitted by the gate lines, the TFTs transfer pixel signals from corresponding data lines to corresponding pixel electrodes.

The color filter substrate typically includes color filters arranged within each pixel area, a black matrix dividing color filters and reflecting external light, and a common electrode applying a reference voltage to the pixel areas, and an alignment film coated thereon.

Constructed as described above, the TFT and color filter substrates are joined together with a sealant and liquid crystal material is injected into the cell gap to complete fabrication of the LCD panel.

The related art process used to fabricate the TFT substrate described above can be complicated and relatively expensive because it involves a number of semiconductor processing techniques that require a plurality of mask processes. It is generally known that a single mask process requires many sub-processes such as thin film deposition, cleaning, photolithography, etching, photo-resist stripping, inspection, etc. To reduce the complexity and cost associated with fabricating TFT substrates, procedures have been developed to minimize the number of mask processes required. Accordingly, a four-mask process has been developed that removes the necessity of a mask process from a standard five-mask process.

FIG. 1 illustrates a plan view of a TFT substrate of an LCD device, fabricated using a related art four-mask process. FIG. 2 illustrates a sectional view of the TFT substrate taken along the I–I' line shown in FIG. 1.

Referring to FIGS. 1 and 2, the TFT substrate includes a lower substrate 42 supporting gate lines 2, data lines 4 crossing the gate lines 2 to define a plurality of pixel areas, a gate insulating film 44 between the gate and data lines 2 and 4, a TFT 6 provided each crossing of the gate and data lines 2 and 4, a pixel electrode 18 provided at each pixel area. The TFT substrate further supports a storage capacitor 20 provided at a region where the pixel electrode 18 overlaps a pre-stage gate line 2, a gate pad portion 26 connected to the gate line 2, and a data pad portion 34 connected to the data line 4.

In response to a gate signal applied from a gate line 2, a TFT 6 charges and maintains a pixel signal, applied to a corresponding data line 4, in the pixel electrode 18. Accordingly, each TFT 6 includes a gate electrode 8 connected to a corresponding gate line 2, a source electrode 10 connected to a corresponding data line 4, a drain electrode 12 connected to a corresponding pixel electrode 18, and an active layer 14 overlapping the gate electrode 8. The active layer 14 is overlapped by the data line 4, a lower data pad electrode 36, a storage electrode 22, and defines a channel between the source and drain electrodes 10 and 12 that also overlap the active layer 14. An ohmic contact layer 48 is formed on the active layer 14 and ohmically contacts the data line 4, the source electrode 10, and the drain electrode 12, the lower data pad electrode 36, and storage electrode 22.

Each pixel electrode 18 is connected to a drain electrode 12 of a corresponding TFT 6 via a first contact hole 16 formed through a protective film 50. During operation, an electric field may be generated between the pixel electrode 18 and a common electrode supported by an upper substrate (not shown). The liquid crystal material has a particular dielectric anisotropy. Therefore, in the presence of the electric field, molecules within the liquid crystal material rotate to align themselves vertically between the TFT and color filter substrates. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

Each storage capacitor 20 consists of a gate line 2 and the portion of the storage electrode 22 overlapping the gate line 2, wherein the two conductors are separated by the gate insulating film 44, the active layer 14, and the ohmic contact layer 48. The pixel electrode 18 is connected to the storage electrode 22 via a second contact hole 24 formed through the protective film 50. Constructed as described above, the storage capacitor 20 allows pixel signals charged at the pixel electrode 18 to be uniformly maintained until a next pixel signal is charged at the pixel electrode 18.

Each gate line 2 is connected to a gate driver (not shown) via a corresponding gate pad portion 26. Accordingly, the gate pad portion 26 consists of a lower gate pad electrode 28 and an upper gate pad electrode 32. The lower gate pad electrode 28 is an extension of gate line 2 and is connected to the upper gate pad electrode 32 via a third contact hole 30 formed through the gate insulating film 44 and the protective film 50.

Each data line 4 is connected to a data driver (not shown) via a corresponding data pad portion 34. Accordingly, the data pad portion 34 consists of a lower data pad electrode 36 and an upper data pad electrode 40. The lower data pad electrode 36 is an extension of the data line 4 and is connected to the upper data pad electrode 40 via a fourth contact hole 38 formed through the protective film 50.

Having described the TFT substrate above, a method of fabricating the TFT substrate according to the related art four-mask process will now be described in greater detail with reference to FIGS. 3A to 3D.

Referring to FIG. 3A, a gate metal pattern, including the gate line 2, the gate electrode 8, and the lower gate pad electrode 28, is formed on the lower substrate 42 in a first mask process.

Specifically, a gate metal layer is formed over the entire surface of the lower substrate 42 using a deposition technique such as sputtering. The gate metal layer consists of a single-layer or double-layer structure of chrome (Cr), molybdenum (Mo) or an aluminum group metal, etc. The gate metal layer is then patterned using photolithography and etching techniques in conjunction with an overlaying first mask pattern to provide the aforementioned gate metal pattern.

Referring next to FIG. 3B, a gate insulating film 44 is coated over the entire surface of the lower substrate 42 and on the gate metal pattern. In a second mask process, a semiconductor pattern and a data metal pattern are provided on the gate insulating film 44. The semiconductor pattern consists of the active layer 14 and the ohmic contact layer 48. The data metal pattern consists of the data line 4, the source electrode 10, the drain electrode 12, the lower data pad electrode 36, and the storage electrode 22.

Specifically, the gate insulating film 44, a first and a second semiconductor layer, and a data metal layer are sequentially formed over the surface of the lower substrate 42 and on the gate metal pattern by deposition techniques such as plasma enhanced chemical vapor deposition (PECVD) and sputtering. The gate insulating film 44 typically includes an inorganic insulating material such as silicon nitride (SiNx) or silicon oxide (SiOx). The active layer 14 is formed from the first semiconductor layer and typically includes undoped amorphous silicon. The ohmic contact layer 48 is formed from the second semiconductor layer and typically includes N- or P-doped amorphous silicon. The data metal layer typically includes molybdenum (Mo), titanium (Ti), tantalum (Ta).

A photo-resist film is then formed over the data metal layer and is photolithographically patterned using a second mask pattern. Specifically, the second mask pattern is provided as a diffractive exposure mask having a diffractive exposure region corresponding to a channel region of a subsequently formed TFT. Upon exposure through the second mask pattern and development, a photo-resist pattern is created wherein a portion of the photo-resist film remaining in a region corresponding to the channel region has a lower height relative to portions of the photo-resist film remaining in regions outside the channel region.

Subsequently, the photo-resist pattern is used as a mask to pattern the data metal layer in a wet etching process and to form the aforementioned data metal pattern (i.e., the data line 4, the source electrode 10, the drain electrode 12, and the storage electrode 22), wherein the source and drain electrodes 10 and 12 are connected to each other in a region corresponding to the channel region. Next, the photo-resist pattern is used as a mask to sequentially pattern the first and second semiconductor layers in a dry etching process and form the active layer 14 and the ohmic contact layer 48.

After the active and ohmic contact layers 14 and 48 are formed, the portion of the photo-resist having the relatively lower height is removed from the region corresponding to the channel region in an ashing process. Upon performing the ashing process, the relatively thicker portions of the photo-resist in regions outside the channel region are thinned but, nevertheless, remain. Using the photo-resist pattern as a mask, the portion of the data metal layer and the ohmic contact layer 48 arranged in the channel region are then etched in a dry etching process. As a result, the active layer 14 within the channel region is exposed, the source electrode 10 is disconnected from the drain electrode 12, and the remaining photo-resist pattern is removed in a stripping process.

Referring next to FIG. 3C, the protective film 50 is coated over the entire surface of the lower substrate 42, including the gate insulting film 44, the data metal pattern, and the active layer 14. In a third mask process, the first to fourth contact holes 16, 24, 30, and 38, respectively, are formed through the protective film 50 and gate insulting film 44.

Specifically, the protective film 50 is formed over the surface of the lower substrate 42, including the gate insulting film 44, the data metal pattern, and the active layer 14 by a deposition technique such as plasma enhanced chemical vapor deposition (PECVD). The protective film 50 typically includes an inorganic insulating material such as silicon nitride (SiNx) or silicon oxide (SiOx), or an organic material having a small dielectric constant such as an acrylic organic compound, BCB (benzocyclobutene) or PFCB (perfluorocyclobutane). A third mask pattern is then arranged over the protective film 50 and the protective film 50 is then patterned by using photolithography and etching processes to thereby define the first to fourth contact holes 16, 24, 30, and 38.

The first contact hole 16 is formed through the protective film 50 to expose the drain electrode 12, the second contact hole 24 is formed through the protective film 50 to expose the storage electrode 22, the third contact hole 30 is formed through the protective film 50 and the gate insulating film 44 to expose the lower gate pad electrode 28, and the fourth contact hole 38 is formed through the protective film 50 to expose the lower data pad electrode 36.

Referring next to FIG. 3D, a transparent conductive pattern including the pixel electrode 18, the upper gate pad electrode 32, and the upper data pad electrode 40 are formed on the protective film 50 in a fourth mask process.

Specifically, a transparent conductive material is coated over the entire surface of the protective film 50 and in the first to fourth contact holes 16, 24, 30, and 38 by a deposition technique such as sputtering. The transparent conductive material typically includes indium-tin-oxide (ITO), tin-oxide (TO), indium-zinc-oxide (IZO) or indium-tin-zinc-oxide (ITZO). In a fourth mask process, the transparent conductive material is patterned using photolithographic and etching techniques to thereby form the aforementioned transparent conductive pattern (i.e., the pixel electrode 18, the upper gate pad electrode 32, and the upper data pad electrode 40).

Accordingly, the pixel electrode 18 is electrically connected to the drain electrode 12 via the first contact hole 16 while also being electrically connected to the storage electrode 22, via the second contact hole 24. The upper gate pad electrode 32 is electrically connected to the lower gate pad electrode 28 via the third contact hole 30 and the upper data pad electrode 40 is electrically connected to the lower data pad electrode 36 via the fourth contact hole 40.

While the TFT substrate described above may be formed using a four-mask process that is advantageous over previously known five-mask processes, the four-mask process can still be undesirably complicated and, therefore, costly. Accordingly, it would be beneficial to fabricate a TFT substrate according to a less complex, and therefore less costly, process.

SUMMARY OF THE INVENTION

Accordingly, the present invention is directed to thin film transistor (TFT) substrate for a display device and a method of fabricating the same that substantially obviates one or more of the problems due to limitations and disadvantages of the related art.

An advantage of the present invention provides a TFT substrate for a display device and a method of fabricating the same in a reduced number of mask processes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a TFT substrate for a display device may, for example, include a gate line; a data line crossing the gate line to define a pixel area; a gate insulating film between the gate and data lines; a TFT at the crossing of the gate and data lines, wherein the TFT includes a gate electrode connected to the gate line, a source electrode connected to the data line, a drain electrode opposed to the source electrode, a semiconductor pattern, and a channel region between the source and drain electrodes; a protective film over the gate line, the data line, and the TFT; a pixel hole defined within the protective film and the gate insulating film, the pixel hole arranged within the pixel area and outside the pixel area; a pixel electrode within the portion of the pixel hole arranged within the pixel area and contacting a side surface of the drain electrode; a first storage capacitor including a first portion of the gate line, a first upper storage electrode over the first portion of the gate line, and the gate insulating film and semiconductor layer between the first portion of the gate line and the first upper storage electrode; a second storage capacitor including a second portion of the gate line, a second upper storage electrode over the second portion of the gate line and contacting a side surface of the first upper storage electrode, and the gate insulating film between the second portion of the gate line and the second upper storage electrode.

In one aspect of the present invention, the pixel electrode and the second upper storage electrode may directly contact the protective film.

In another aspect of the present invention, the semiconductor layer may, for example, include an active layer and an ohmic contact layer formed on the active layer outside the channel region, wherein the active layer is between the second upper storage electrode and the gate insulating film.

In still another aspect of the present invention, the TFT substrate may further include a lower gate pad electrode extending from the gate line; a first contact hole through the protective film and the gate insulating film, wherein the lower gate pad electrode is exposed by first contact hole; and a gate pad portion directly contacting the protective film within the contact hole, wherein the gate pad portion includes an upper gate pad electrode contacting the lower gate pad electrode within the first contact hole.

In yet another aspect of the present invention, the TFT substrate may further include a lower data pad electrode extending from the data line; a second contact hole formed through the protective film and the lower data pad electrode; and a data pad portion directly contacting the protective film within the second contact hole, wherein the data pad portion includes an upper data pad electrode contacting a side surface of the lower data pad electrode within the second contact hole.

In still a further aspect of the present invention, the data pad portion may, for example, include an ohmic contact layer and an active layer provided between the lower data pad electrode and the gate insulating film; wherein the second contact hole may extend through the ohmic contact layer and at least partially through the active layer. Further, the second contact hole may extend completely through the active layer and expose the gate insulating film.

According to principles of the present invention, a method of fabricating a TFT substrate for a display device may, for example, include forming, on a substrate, a gate line and a gate electrode connected to the gate line; covering the gate line and the gate electrode with a gate insulating film; forming a semiconductor layer over a predetermined area of the gate insulating film; forming a data line, a source electrode connected to the data line, a drain electrode, and a first upper storage electrode, wherein the data line crosses the gate line to define a pixel area, wherein the drain electrode is separated from the source electrode at a channel region by the semiconductor layer, wherein the first upper storage electrode overlaps a first portion of the gate line, and wherein the gate insulating film and the semiconductor layer are between the first upper storage electrode and the first portion of the gate line; forming a protective film over the gate line, the data line, and the TFT; wherein the pixel hole is arranged within the pixel area and outside the pixel area and wherein forming the pixel hole includes removing a portion of the first upper storage electrode outside the pixel area; forming a pixel electrode within the portion of the pixel hole arranged within the pixel area, wherein the pixel electrode contacts a side surface of the drain electrode; and forming a second upper storage electrode extending from the pixel electrode within the pixel hole and contacting a side surface of the first upper storage electrode.

In one aspect of the present invention, the semiconductor layer may, for example, include an active layer and an ohmic contact layer formed on the active layer outside the channel region, wherein an upper surface of the active layer exposed within the pixel hole.

In another aspect of the present invention, the method may further include forming a lower gate pad electrode extending from the gate line; forming a first contact hole through the protective film and the gate insulating film, wherein the first contact hole exposes the lower gate pad electrode; and forming an upper gate pad electrode directly contacting the protective film within the first contact hole, wherein the upper gate pad electrode contacts the lower gate pad electrode.

In still another aspect of the present invention, the method may further include forming a lower data pad electrode extending from the data line and overlapping the semiconductor layer; forming a second contact hole through the protective film and the lower data pad electrode; and forming an upper data pad electrode directly contacting the protective film within the second contact hole, wherein the upper data pad electrode contacts a side surface of the lower data pad electrode.

In yet another aspect of the present invention, the second contact hole may be formed by forming an active layer over the gate insulating film; and forming an ohmic contact layer over the active layer, wherein the second contact hole extends through the ohmic contact layer and the active layer.

According to principles of the present invention, a method of fabricating a thin film transistor substrate for a display device may, for example, include forming a gate metal layer on a substrate; forming a gate metal pattern from the gate metal layer, wherein the gate metal pattern includes a gate line and a gate electrode; depositing a gate insulating film, an undoped amorphous silicon layer, a doped amorphous silicon layer, and a data metal layer over the gate metal pattern; forming a data metal pattern, an ohmic contact layer, and an active layer, the data metal pattern including a data line, a source electrode, a drain electrode, and a first upper storage electrode, wherein the data line crosses the gate line to define a pixel area, wherein the drain electrode is separated from the source electrode at a channel region by the active layer, and wherein the first upper storage electrode overlaps the gate line; forming a pixel hole through the gate insulating film within the pixel area and outside the pixel area, wherein forming the pixel hole includes removing a portion of the first upper storage electrode outside the pixel area; forming a pixel electrode within the portion of the pixel hole arranged within the pixel area, the pixel electrode contacting a side surface of the drain electrode within the pixel hole; and forming a second upper storage electrode extending from the pixel electrode within the pixel hole and contacting a side surface of the first upper storage electrode.

In one aspect of the present invention, forming the data metal pattern, the ohmic contact layer, and the active layer may, for example, include forming a photo-resist pattern on the data metal layer, wherein a first portion of the photo-resist pattern outside the channel region has a first thickness, wherein a second portion of the photo-resist pattern within the channel region has a second thickness less than the first thickness; patterning the data metal layer, the doped amorphous silicon layer, and the undoped amorphous silicon layer using the photo-resist pattern; ashing the photo-resist pattern to remove the second portion of the photo-resist pattern; removing portions of the data metal pattern and the doped amorphous silicon layer within the channel region using the ashed photo-resist pattern as a mask; and removing the ashed photo-resist pattern.

In another aspect of the present invention, forming the pixel electrode may, for example, include forming a protective film over the data metal pattern; forming a photo-resist pattern over the protective film, the photo-resist pattern exposing a portion of the protective film at the pixel area and outside the pixel area; etching the exposed portions of the protective film and the gate insulating film using the photo-resist pattern as a mask, thereby forming the pixel hole; forming a transparent conductive material over the photo-resist pattern and within the pixel hole; and removing the photo-resist pattern and portions of the transparent conductive material on the photo-resist pattern by a lift-off process, thereby forming the pixel electrode and the second upper storage electrode.

In still another aspect of the present invention, the pixel hole may, for example, be formed by etching a portion of the drain electrode and a portion of the first upper storage electrode exposed by the photo-resist pattern.

In yet another aspect of the present invention, an upper surface of the active layer may be exposed within the pixel hole In still a further aspect of the present invention, the method may further include while forming the pixel hole, forming a lower gate pad electrode connected to the gate line; forming a first contact hole through the protective film and the gate insulating film to expose the lower gate pad electrode; and forming an upper gate pad electrode contacting the protective film within the first contact hole, the upper gate pad electrode contacting to the lower gate pad electrode.

In yet another aspect of the present invention, the method may further include forming a lower data pad electrode connected to the data line; forming a second contact hole through the protective film and the lower data pad electrode; and forming an upper data pad electrode directly contacting the protective film, the upper data pad electrode contacting a side surface of the lower data pad electrode.

In still another aspect of the present invention, the method may further include forming the undoped and doped amorphous silicon layers overlapping the lower data pad electrode; and forming the second contact hole through at least a portion of at least one of the undoped and doped amorphous silicon layers. Further, the second contact hole may be formed entirely through the undoped amorphous silicon layer, exposing the gate insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 8A and 8B illustrate plan and sectional views, respectively, describing a first mask process in the method of fabricating the TFT substrate according to the principles of the present invention;

FIGS. 9A and 9B illustrate plan and sectional views, respectively, generally describing a second mask process in the method of fabricating the TFT substrate according to the principles of the present invention;

FIGS. 10A to 10D illustrate sectional views specifically describing the second mask process in the method of fabricating the TFT substrate according to the principles of the present invention;

FIGS. 11A and 11B illustrate plan and sectional views, respectively, generally describing a third mask process in the method of fabricating the TFT substrate according to the principles of the present invention; and FIGS. 12A to 12D illustrate sectional views specifically describing the third mask process in the method of fabricating the TFT substrate according to the principles of the present invention.

DETAILED DESCRIPTION OF THE ILLUSTRATED EMBODIMENTS

Reference will now be made in detail to embodiments of the present invention, examples of which are illustrated in the accompanying drawings.

Figure 1:
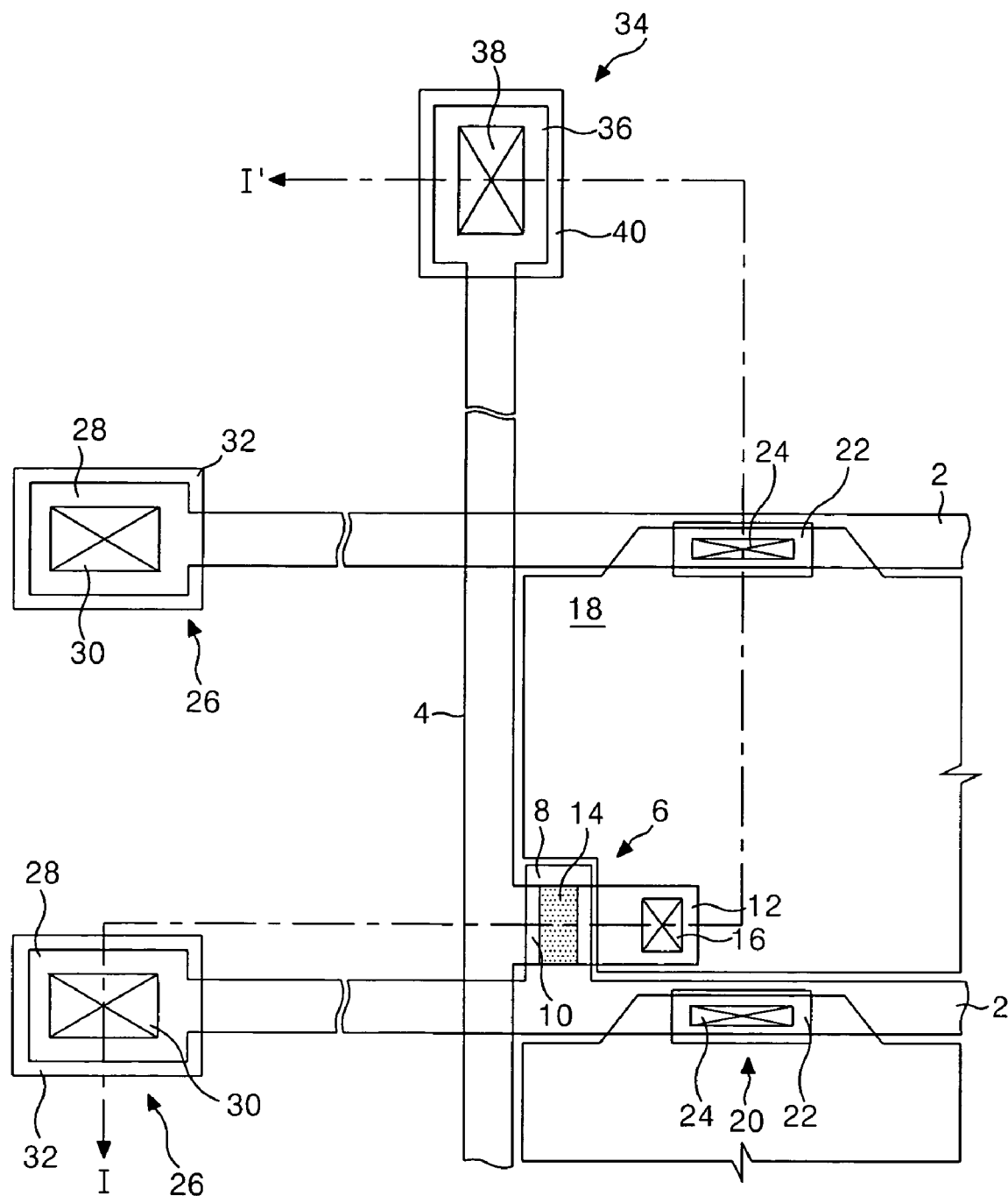
FIG. 1 illustrates a plan view of a thin film transistor (TFT) substrate, fabricated using a related art four-mask process.
Figure 2:
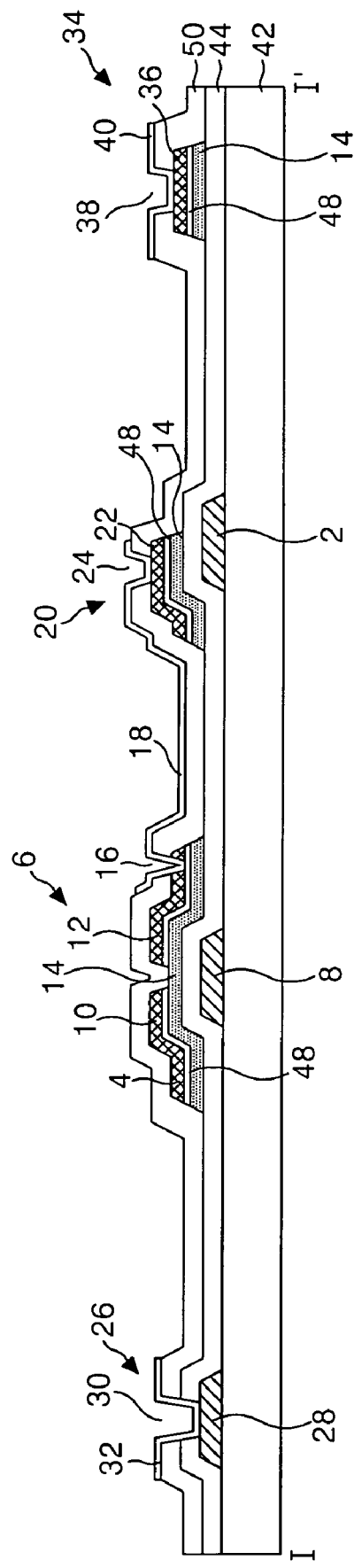
FIG. 2 illustrates a sectional view of the TFT substrate taken along line I–I' shown in FIG. 1.
Figure 3A:
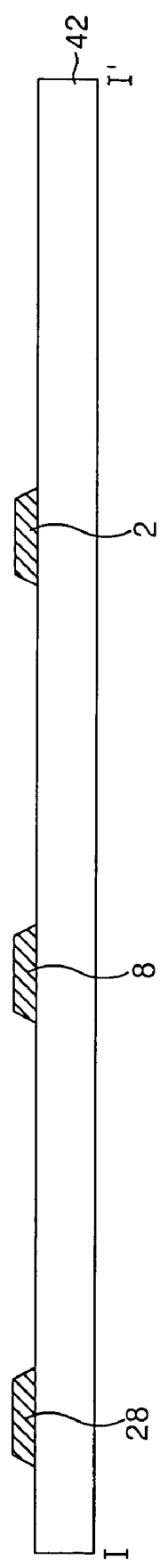
FIGS. 3A to 3D illustrate a method of fabricating the TFT substrate shown in FIG. 2.
Figure 3B:
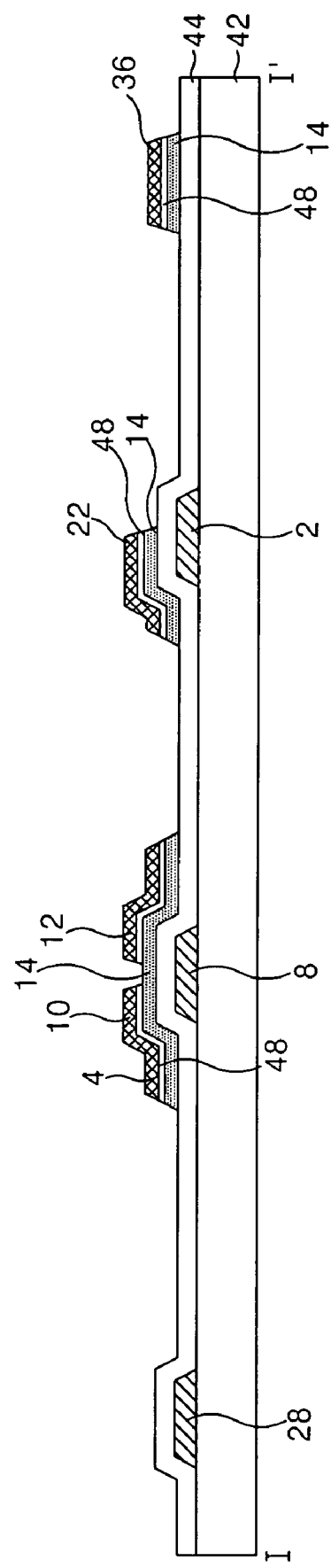
Figure 3C:
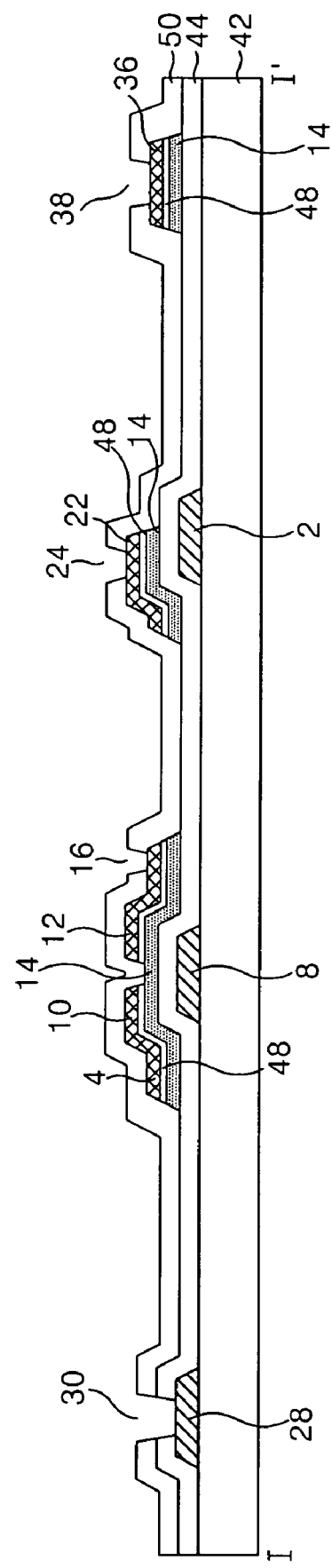
Figure 3D:
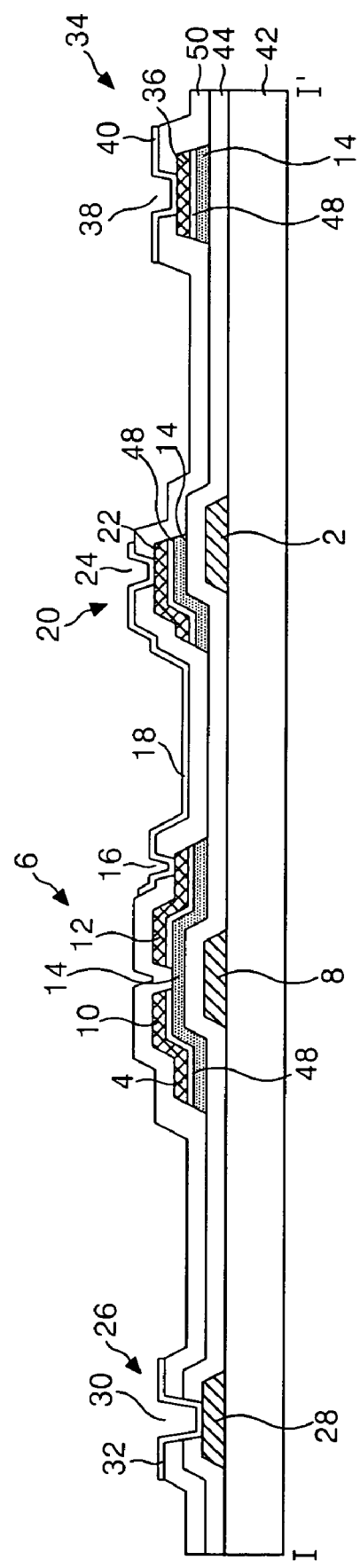
Figure 4:
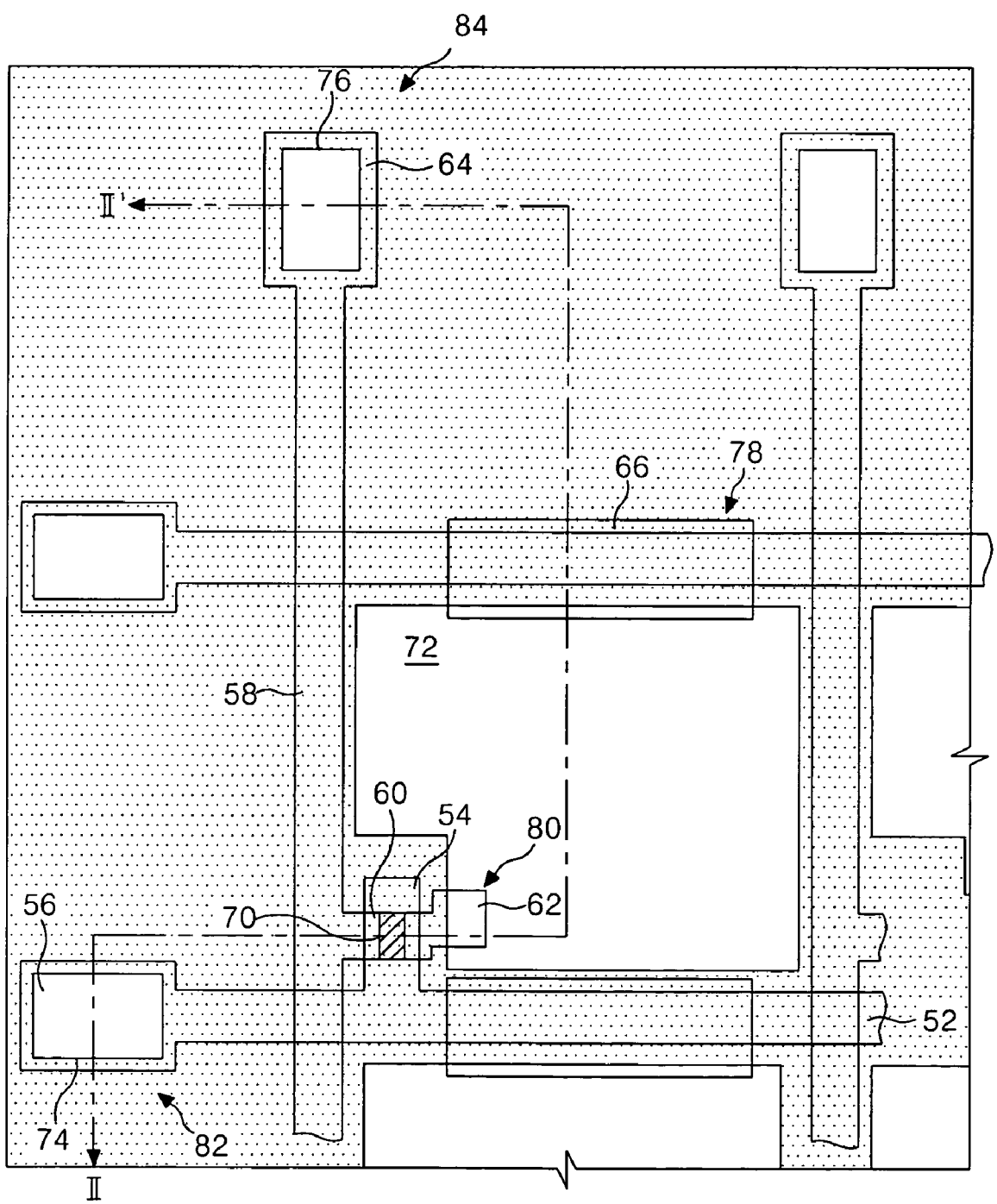
FIG. 4 illustrates a plan view of a portion of a related art TFT substrate.
Figure 5:
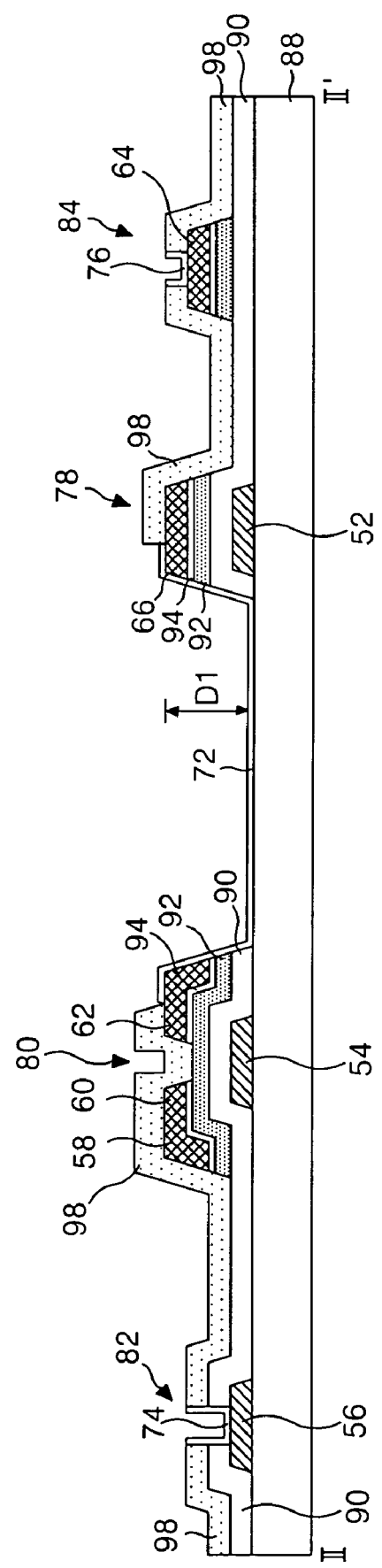
FIG. 5 illustrates a sectional view of the related art TFT substrate taken along line II–II' shown in FIG. 4.

FIG. 4 illustrates a plan view of a portion of a related art TFT substrate disclosed in Korean Patent Application No. 2002-88323. FIG. 5 illustrates a sectional view of the related TFT substrate taken along line II–II' shown in FIG. 4.

Referring to FIGS. 4 and 5, the related art TFT substrate includes a lower substrate 88 supporting a TFT 80 that includes a gate electrode 54 connected to a gate line 52, a source electrode 60 connected to a data line 58, a drain electrode 62 connected to a pixel electrode 72 and separated from the source electrode 60 by a channel 70 in an underlying active layer 92, and an ohmic contact layer 94 formed on the active layer 92 outside the channel 70 that ohmically contacts the source and drain electrodes 60 and 62.

The active and ohmic contact layers 92 and 94 overlap the gate electrode 54 and the gate line 52 and are overlapped by the source electrode 60, the drain electrode 62, the data line 58, a data pad 64, and an upper storage electrode 66.

The pixel electrode 72 is arranged within the pixel area and is connected to a portion of the drain electrode 62 that is exposed by a protective film 98.

A storage capacitor 78 comprises the upper storage electrode 66 overlapping a portion of a pre-stage gate line 52 and separated from the pre-stage gate line 52 by a gate insulating film 90, the active layer 92, and the ohmic contact layer 94. The upper storage electrode 66 is connected to the pixel electrode 72.

A gate pad portion 82 comprises a lower gate pad electrode 56 extending from the gate line 52 and an upper gate pad electrode 74 connected to the lower gate pad electrode 56.

A data pad portion 84 comprises a lower data pad electrode 64 extending from the data line 58 and an upper data pad electrode 76 connected to the lower data pad electrode 64.

The TFT substrate described with respect to FIGS. 4 and 5 is formed in a three-mask process. Generally, the number of mask processes used to obtain the TFT array shown in FIGS. 4 and 5 is reduced from four to three by patterning a transparent conductive material (e.g., the film used to form the pixel electrode 72, the upper gate pad electrode 74, and the upper data pad electrode 76) according to a lift-off process. Thus, a first mask process may, for example, involve forming a gate metal pattern over the lower substrate 88, wherein the gate metal pattern includes the gate line 52, the gate electrode 54, and the lower gate pad electrode 56. A second mask process may, for example, include forming a data metal pattern over the gate metal pattern, wherein the data metal pattern includes the source electrode 60, the drain electrode 62, the data line 58, the lower data pad electrode 64, and the upper storage electrode 66. A third mask process may, for example, include forming a mask pattern over the protective film 98, removing portions (i.e., patterning) the protective film 98 and the gate insulating film 90 using the mask pattern as a mask so as to form a plurality of contact holes therein, depositing a transparent conductive layer over the resulting structure and within the contact holes, and removing the mask pattern in a lift-off process such that portions of the transparent conductive layer not on the mask pattern remain within the contact holes and on side surfaces thereof to form the pixel electrode 72, the upper gate pad electrode 74, and the upper data pad electrode 76.

While beneficially reducing the number of mask processes applied from four to three, fabricating the related art TFT substrate as described above with respect to FIGS. 4 and 5 may be disadvantageous because of a large difference in elevation D1 between the pixel electrode 72, arranged within the contact hole formed at the pixel area, and the upper storage electrode 66, arranged outside the contact hole and outside the pixel area. Moreover, the sidewalls that define the contact hole in which the pixel electrode 72 are straight and relatively steep. The combined effects of the large elevational difference and steep sidewall topography may cause a poor alignment of liquid crystal material, undesirably resulting in light leakage of the device. Further, the distance between the upper storage electrode 66 and pre-stage gate line 52 within storage electrode 78 is large, resulting in an undesirably low capacitance value of the storage capacitor 78 and making it difficult to stably maintain charges at the pixel electrode 72.

To overcome such disadvantages, a TFT substrate according to principles of the present invention may reduce the step difference between the edge and central portions of the pixel electrode to substantially prevent light leakage and to increasing a capacitance value of the storage capacitor.

Figure 6:
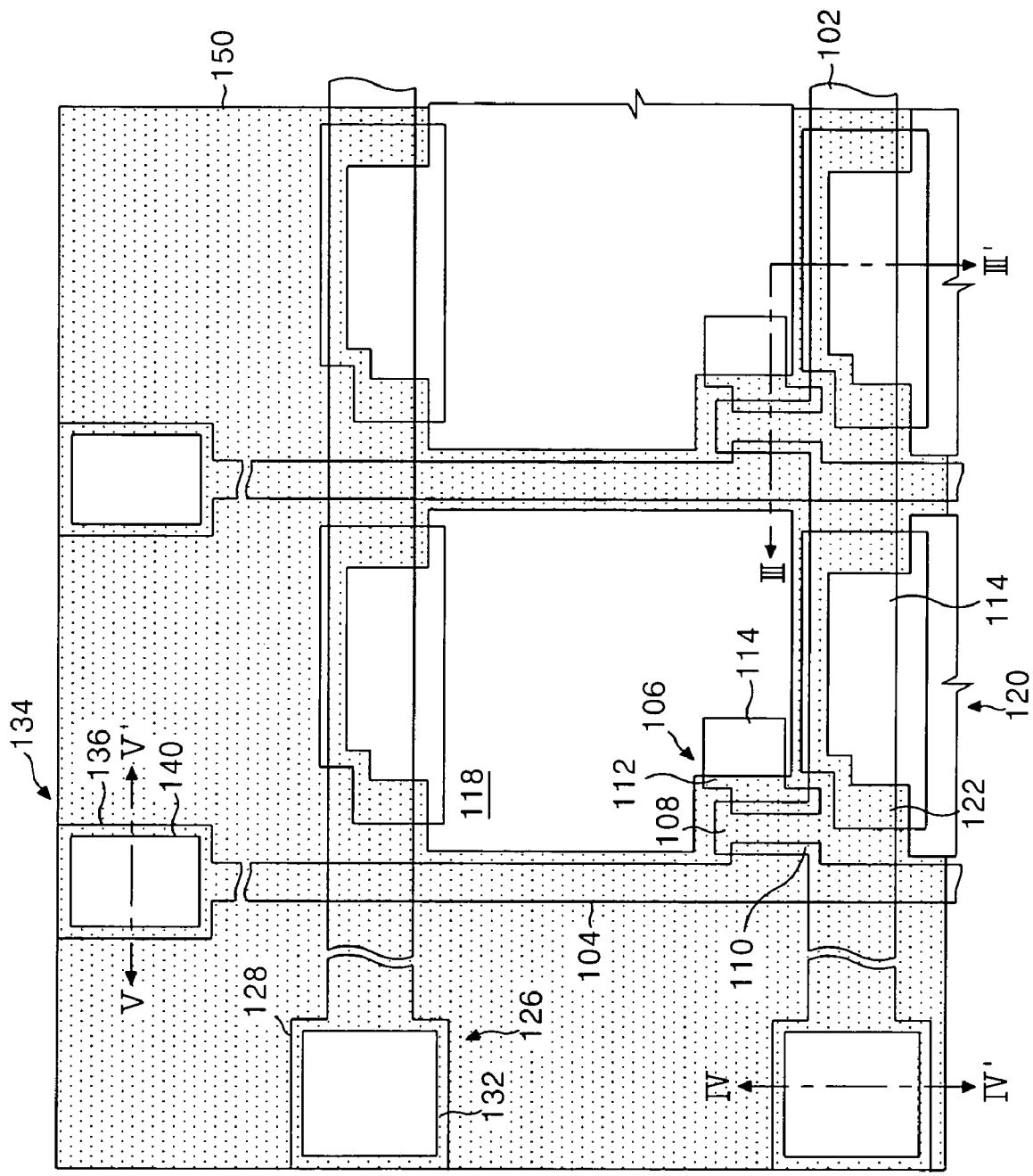
FIG. 6 illustrates a plan view of a TFT substrate according to the principles of the present invention.
Figure 7:
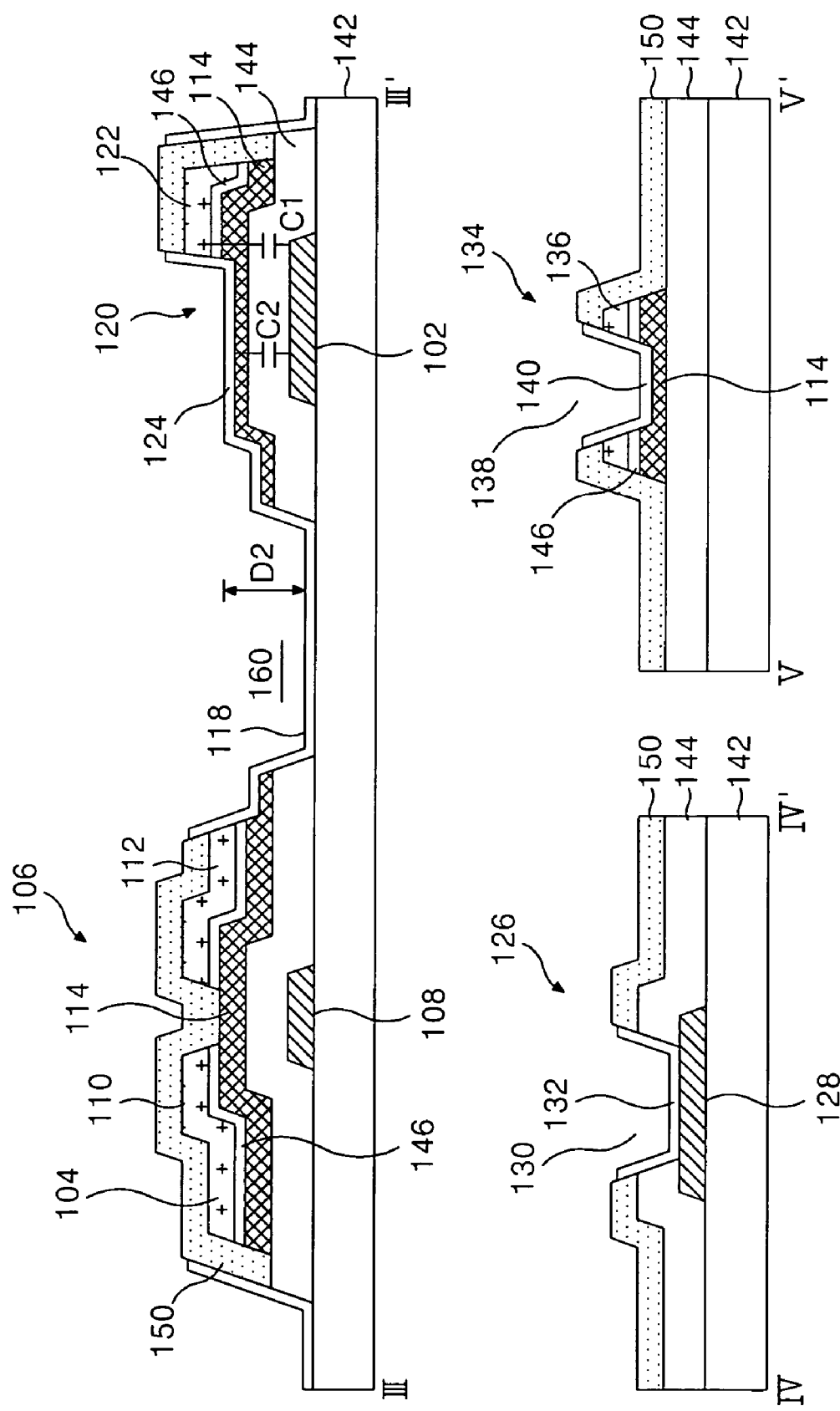
FIG. 7 illustrates a sectional view of the TFT substrate taken along lines III–III', IV–IV' and V–V' shown in FIG. 6.

FIG. 6 illustrates a plan view of a TFT substrate according to the principles of the present invention. FIG. 7 illustrates a sectional view of the TFT substrate taken along lines III–III', IV–IV' and V–V' shown in FIG. 6.

Referring to FIGS. 6 and 7, the TFT substrate according to the principles of the present invention, incorporated within an LCD panel, may, for example, include gate lines 102 and data lines 104 formed so as to cross each other on a lower substrate 142 to define a plurality of pixel areas; a gate insulating pattern 144 formed between the gate and data lines 102 and 104; a thin film transistor 106 at each crossing of the gate and data lines 102 and 104; and a pixel electrode 118 arranged within each pixel area. The TFT substrate may further include a storage capacitor 120 provided at a region where an upper storage electrode and a pre-stage gate line 102 overlap, a gate pad portion 126 connected to each gate line 102, and a data pad portion 134 connected to each data line 104. The upper storage electrode may be connected to the pixel electrode 118.

In response to a gate signal supplied to the a gate line 102, a TFT 106 charges and maintains a pixel signal, supplied to a corresponding data line 104, in the pixel electrode 118. Accordingly, each TFT 106 may, for example, include a gate electrode 108 connected to a corresponding gate line 102, a source electrode 110 connected to a corresponding data line 104, and a drain electrode 112 connected to a corresponding pixel electrode 118. Further, each thin film transistor 106 may include an active layer 114 overlapping the gate electrode 108 and insulated therefrom by the gate insulating pattern 144. Accordingly, a channel may be formed in a portion of the active layer 114 between the source electrode 110 and the drain electrode 112. An ohmic contact layer 146 may be formed on the active layer 114 to ohmically contact the data line 104, the source electrode 110, and the drain electrode 112. Further, the active and ohmic contact layers 114 and 146 are overlapped by the data line 104, a lower data pad electrode 136, and a first upper storage electrode 122.

According to principles of the present invention, the pixel electrode 118 may charge pixel signals transferred by the TFT 106 to generate an electric field with a common electrode provided supported by a color filter substrate (not shown). The liquid crystal material has a particular dielectric anisotropy. Therefore, in the presence of the electric field, molecules within the liquid crystal material rotate to align themselves vertically between the TFT and color filter substrates. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

As mentioned above, a pixel area may be defined by crossings of the gate and data lines 102 and 104. According to principles of the present invention, a pixel hole 160 may be formed through portions of a patterned protective film 150 and the gate insulating film 144 within the pixel area and outside the pixel area. In one aspect of the present invention, sidewalls of the pixel hole 160 may, for example, include stepped portions that expose the drain electrode 112, the active layer 114, the ohmic contact layer 146, the gate insulating pattern 114, and the first upper storage electrode 122. Accordingly, the pixel electrode 118 may directly contact the patterned protective film 150 within the pixel hole 160 in addition to a side portion of the drain electrode 112, a side portion of the active layer 114, an upper portion of the active layer 114 exposed by the drain electrode 112, a side surface of the first upper storage electrode 122, and a side portion of the gate insulating film 144. A second upper storage electrode 124, formed within pixel hole 160 and overlapping the pre-stage gate line 102 outside the pixel area, may contact the pixel electrode 118 arranged within the pixel area. In one aspect of the present invention, the second upper storage electrode 124 may directly contact the side surface of the first upper storage electrode 122 that is exposed by the pixel hole 160 and upper portions of the active layer 114 that are exposed by first upper storage electrode 122.

Accordingly, the storage capacitor 120 of the present invention may, for example, include a lower storage electrode (i.e., a portion of the pre-stage gate line 102), a first storage capacitor C1, and a second storage capacitor C2, wherein the second storage capacitor C2 is connected in parallel to the first storage capacitor C1. In one aspect of the present invention, the first storage capacitor C1 may, for example, include a first portion of the lower storage electrode overlapped by the first upper storage electrode 122, wherein the first upper storage electrode 122 is separated from the first portion of the lower storage electrode by the gate insulating film 144, the active layer 114, and the ohmic contact layer 146. In another aspect of the present invention, the second storage capacitor C2 may, for example, include a second portion of the lower storage electrode overlapped by the second upper storage electrode 124, wherein the second upper storage electrode 124 is separated from the second portion of the lower storage electrode by the gate insulating film 144 and, optionally, a portion of the active layer 114.

Because the distance between upper and lower electrodes of second storage capacitor C2 is less than the distance between upper and lower electrodes of the first storage capacitor C1, the capacitance of the second storage capacitor C2 may be made larger than the capacitance value of the first storage capacitor C1. As a result, a total capacitance of the storage capacitor 120, comprised of the first and second storage capacitors C1 and C2 connected in parallel, is C1+C2. Thus, the total capacitance may be made greater than, for example, the capacitance of the storage capacitor 78 shown in FIGS. 4 and 5. Accordingly, charges may be maintained more stably in the pixel electrode 118 than in pixel electrode 72.

Further, because the sidewall topography of the pixel hole 160 is stepped, there may be a relatively small difference D2 in elevation between the pixel electrode 118 within the pixel hole 160 at the pixel area and the second upper storage electrode 124 within the pixel hole 160 outside the pixel area. Accordingly, the liquid crystal alignment problems discussed above with respect to FIGS. 4 and 5 may be substantially eliminated to prevent deleterious light leakage effects in a resultant device.

The gate line 102 may be connected to a gate driver (not shown) via the gate pad portion 126. In one aspect of the present invention, the gate pad portion 126 may comprise a lower gate pad electrode 128 connected to an upper gate pad electrode 132. In another aspect of the present invention, the lower gate pad electrode 128 may extend from the gate line 102. In still another aspect of the present invention, the upper gate pad electrode 132 may be connected to the lower gate pad electrode 128 via a first contact hole 130 formed through the patterned protective film 150 and the gate insulating film 144.

The data line 104 may be connected to a data driver (not shown) via a data pad portion 134. In one aspect of the present invention, the data pad portion 134 may comprise a lower data pad electrode 136 connected to an upper data pad electrode 140. In another aspect of the present invention, the lower data pad electrode 136 may extend from the data line 104. In still another aspect of the present invention, the upper data pad electrode 140 may be connected to a side surface of the lower data pad electrode 136 via a second contact hole 138 formed through the patterned protective film 150. In one aspect of the present invention, the second contact hole 138 may extend through the lower data pad electrode 136. In another aspect of the present invention, the second contact hole 138 may extend through the ohmic contact layer 146. In yet another aspect of the present invention, the second contact hole 138 may extend at least partially through the active layer 114. In still a further aspect of the present invention, the second contact hole 132 may expose at least a portion of the gate insulating pattern 144.

According to principles of the present invention, the pixel electrode 118, the second upper storage electrode 124, the upper gate pad electrode 132, and the upper data pad electrode 140 (collectively, the transparent conductive pattern) may be formed according to a lift-off process, wherein a transparent conductive layer (e.g., the layer used to form transparent conductive pattern) may be deposited over a photo-resist pattern used to form the patterned protective film 150 and the gate insulating film 144 followed by lift-off of the photo-resist pattern. As a result, the transparent conductive pattern may be formed to directly contact the patterned protective film 150 while not overlapping an upper surface thereof.

Figure 8A:
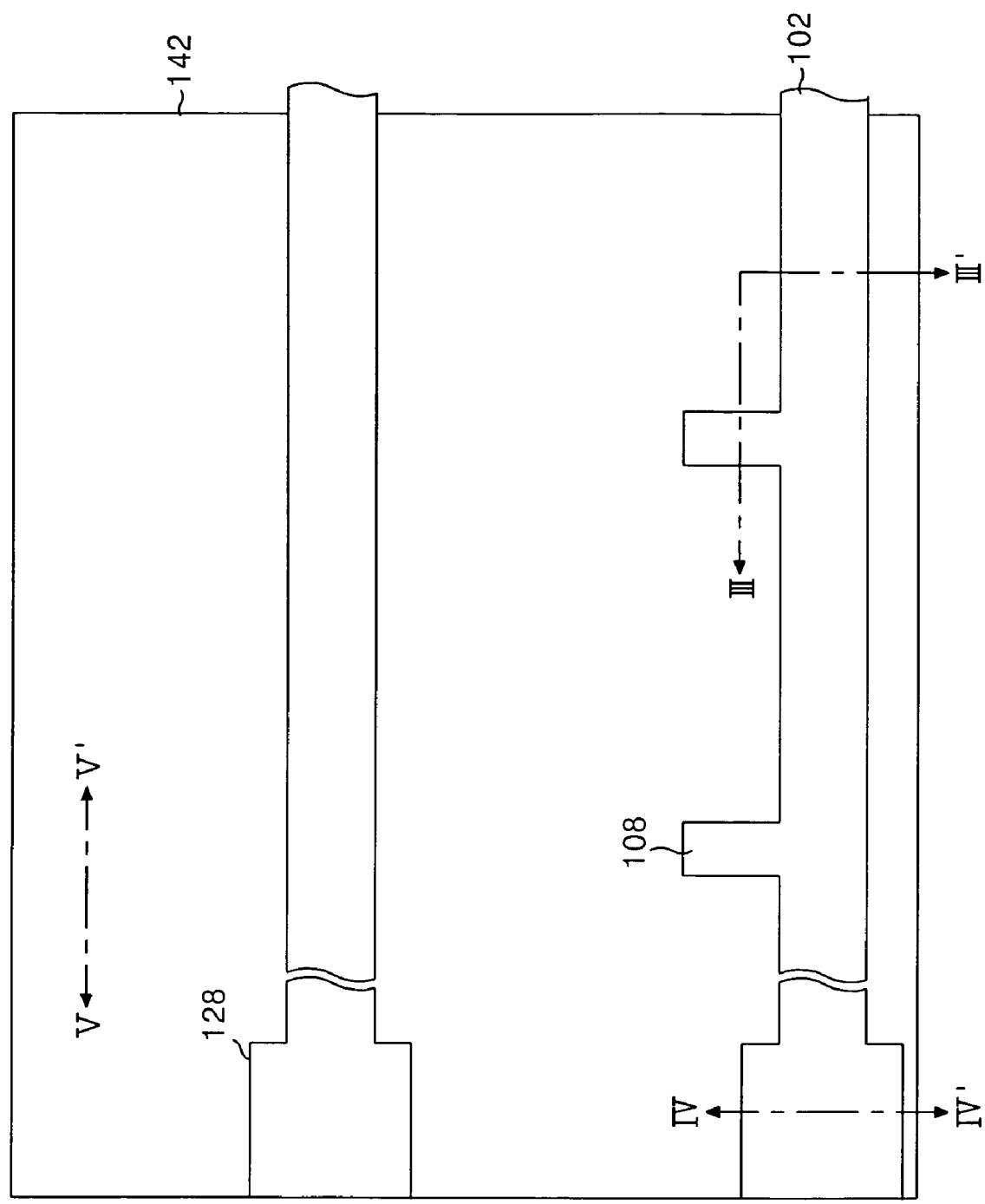

FIGS. 8A and 8B illustrate plan and sectional views, respectively, describing a first mask process in the method of fabricating the TFT substrate according to the principles of the present invention.

Referring to FIGS. 8A and 8B, a gate metal pattern may be formed on the lower substrate 142 in a first mask process. In one aspect of the present invention, the gate metal pattern may include, for example, the gate line 102, the gate electrode 108 connected to the gate line 102, and the lower gate pad electrode 128.

According to principles of the present invention, the gate metal pattern may be formed by depositing a gate metal layer over the lower substrate 142 by a deposition technique such as sputtering. Then, the gate metal layer may be patterned using photolithographic and etching techniques using a first mask to provide the aforementioned gate metal pattern. In one aspect of the present invention, the gate metal may include a material such as Cr, MoW, Cr/Al, Cu, Al(Nd), Mo/Al, Mo/Al(Nd) or Cr/Al(Nd), or the like, or combinations thereof.

FIGS. 9A and 9B illustrate plan and sectional views, respectively, generally describing a second mask process in the method of fabricating the TFT substrate according to the principles of the present invention.

Referring to FIGS. 9A and 9B, a gate insulating film 144A, semiconductor patterns comprised of the active layer 114 and the ohmic contact layer 146, and a data metal pattern comprised of the data line 104, the source electrode 110, the drain electrode 112, the lower data pad electrode 136, and the first upper storage electrode 122, may be formed on the lower substrate 142 and on the gate metal pattern in a second mask process.

FIGS. 10A to 10D illustrate sectional views specifically describing the second mask process in the method of fabricating the TFT substrate according to the principles of the present invention.

Referring to FIG. 10A, the gate insulating film 144A may be formed over the lower substrate 142 and on the gate metal pattern. In one aspect of the present invention, the gate insulating film 144A may be formed according to a deposition technique such as PEVCD, sputtering, or the like. In another aspect of the present invention, the gate insulating film 144A may, for example, include an inorganic insulating material such as silicon nitride (SiNx) or silicon oxide (SiOx).

Next, a first semiconductor layer 114A, a second semiconductor layer 146A, and a data metal layer 105 may be sequentially formed on the gate insulating layer 144A. In one aspect of the present invention, the first and second semiconductor layers 114A and 146A may be formed according to a deposition technique such as PEVCD, sputtering, or the like. In another aspect of the present invention, the first semiconductor layer 114A may, for example, include undoped amorphous silicon. In still another aspect of the present invention, the second semiconductor layer 146A may, for example, include n+ amorphous silicon. In yet another aspect of the present invention, the data metal layer 105 may, for example, include a metal such as Mo, Cu, Al, Cr, or the like, or combinations thereof, that has a suitable etch selectivity with respect to the patterned protective film 150 in a dry etch process.

A first photo-resist film may then be formed over the entire surface of the data metal layer 105 and subsequently be photolithographically patterned using a second mask pattern. According to principles of the present invention, the second mask pattern may, for example, be provided as a partial-exposure mask. For example, the second mask pattern may include a mask substrate formed of a suitably transparent material, a plurality of shielding areas and a partial-exposure area (e.g., a diffractive area or transflective area). It should be noted that areas of the mask that do not support a shielding or partial-exposure areas are exposure areas.

Subsequently, the first photo-resist film may, via the second mask pattern, be selectively exposed to light through the exposure and partial-exposure areas and be developed, thereby creating a first photo-resist pattern 148 having a step difference between the shielding and partial-exposure areas arranged, for example, within a channel region of a subsequently formed TFT that includes the gate electrode 108. Accordingly, the height of the photo-resist pattern within the channel region may be lower than the height of the photo-resist pattern outside the channel region.

Figure 10B:
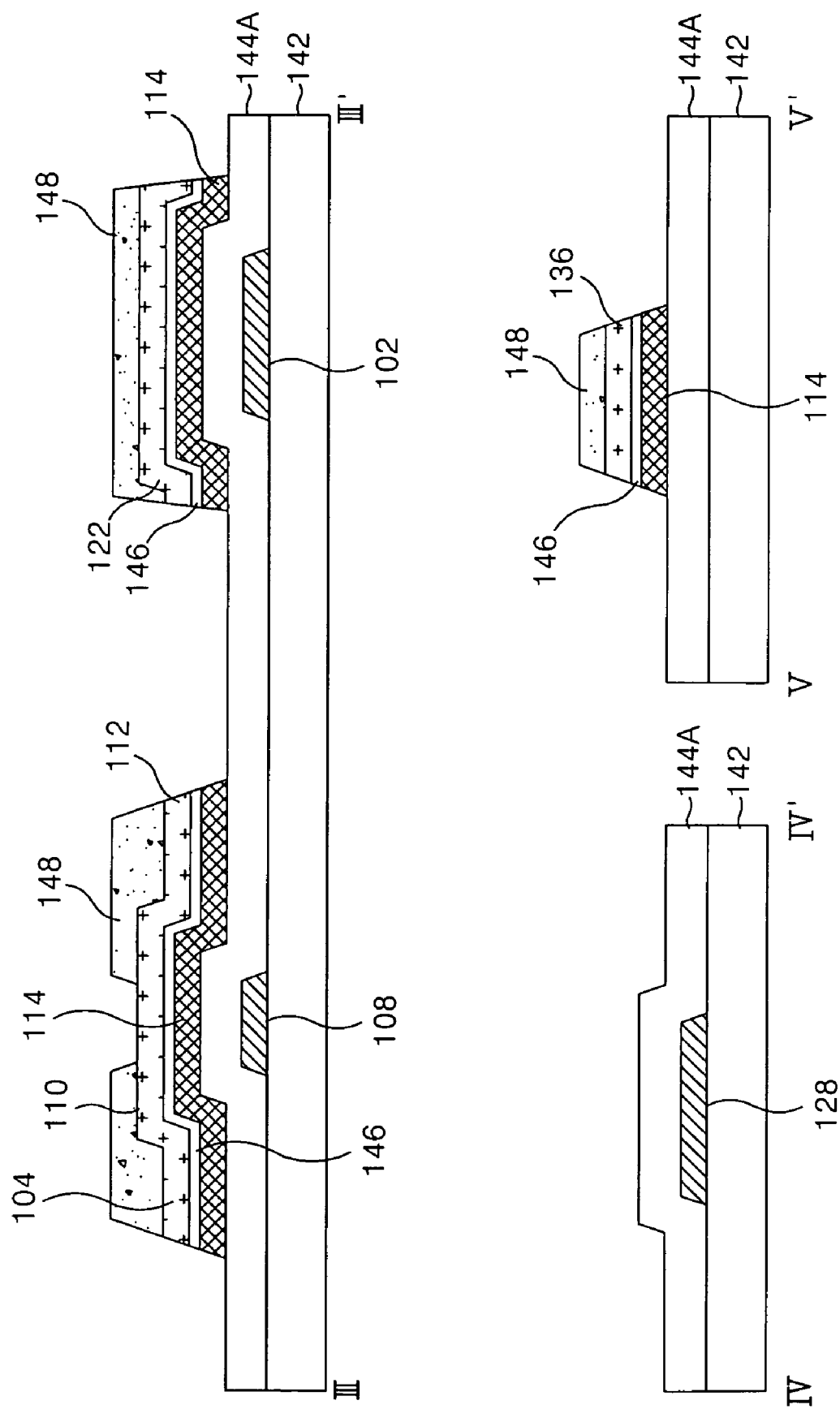

Referring next to FIG. 10B, the first photo-resist pattern 148 may be used as a mask to pattern the data metal layer 105 in a wet etching technique, thereby forming the aforementioned data metal pattern (i.e., the data line 104, the source electrode 110, the drain electrode 112, the first upper storage electrode 122, and the lower data pad electrode 136), wherein the source and drain electrodes 108 and 110 are connected to each other in the channel region, and wherein the first upper storage electrode 122 overlaps the gate line 102.

Next, the first photo-resist pattern 148 may be used as a mask to pattern the first and second contact layers 114A and 146A in a dry etching process to form the active and ohmic contact layers 114 and 146, respectively. In one aspect of the present invention, the patterning may, for example, include removing portions of the active and ohmic contact layers 114A and 146A that are not overlapped by the data metal pattern.

After the active and ohmic contact layers 114 and 146 are formed, the portion of the first photo-resist pattern 148 having the relatively lower height (i.e., the portion of the first photo-resist pattern 148 arranged within the channel region) may be removed in an ashing process using oxygen (O2) plasma. Upon performing the ashing process, the relatively thicker portions of the first photo-resist pattern 148 (i.e., portions of the first photo-resist pattern 148 arranged outside the channel region) are thinned but, nevertheless, remain.

Figure 10D:
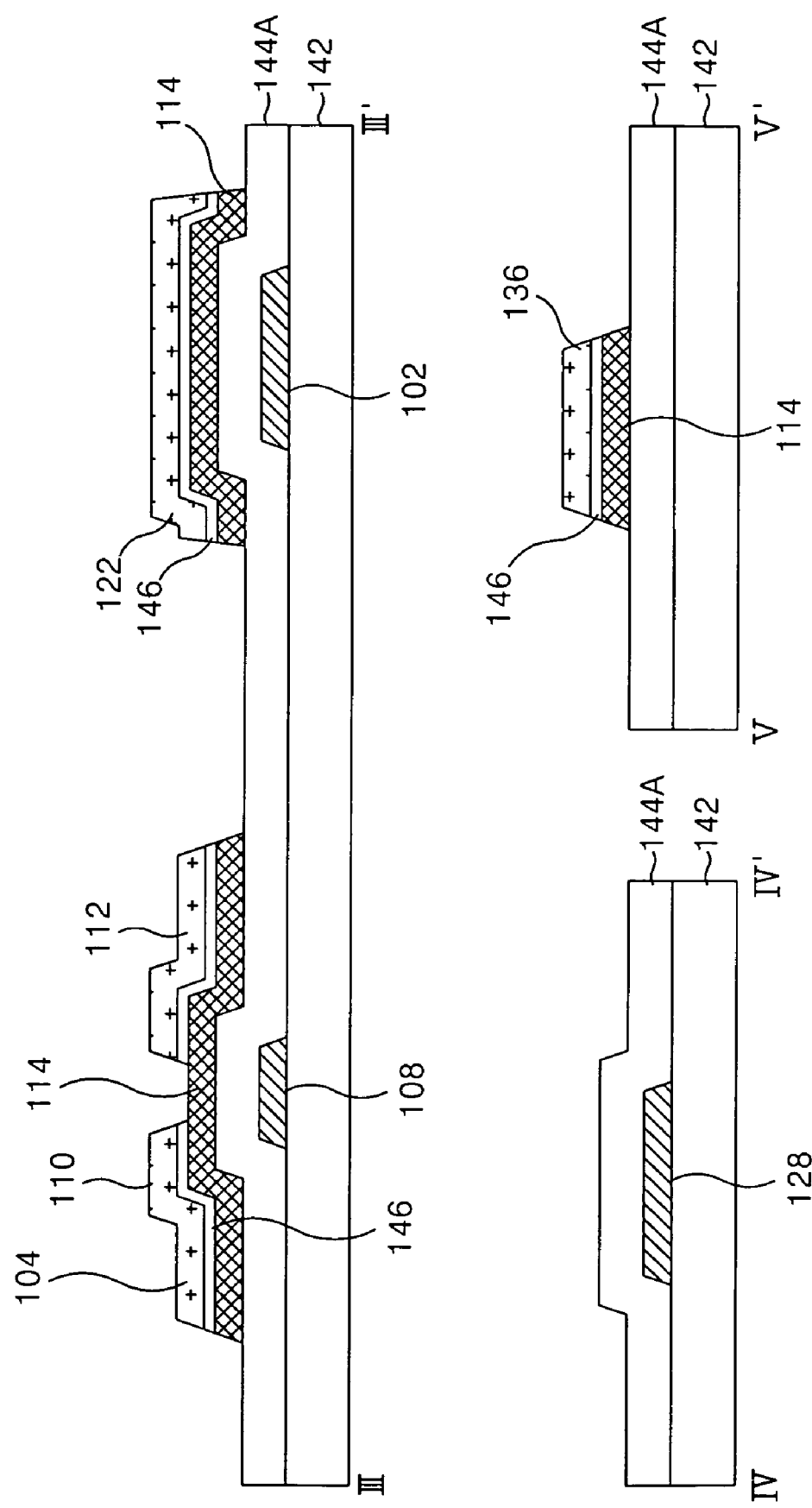

Referring to FIG. 10C, portions of the data metal pattern and the ohmic contact layer 146 in the channel region may be removed in an etching process using the thinned first photo-resist pattern 148 as a mask. As a result, the active layer 114 may be exposed within the channel region and the source electrode 110 may be disconnected from the drain electrode 112. With reference to FIG. 10D, the remaining first photo-resist pattern 148 may then be removed in a stripping process.

Figure 11A:
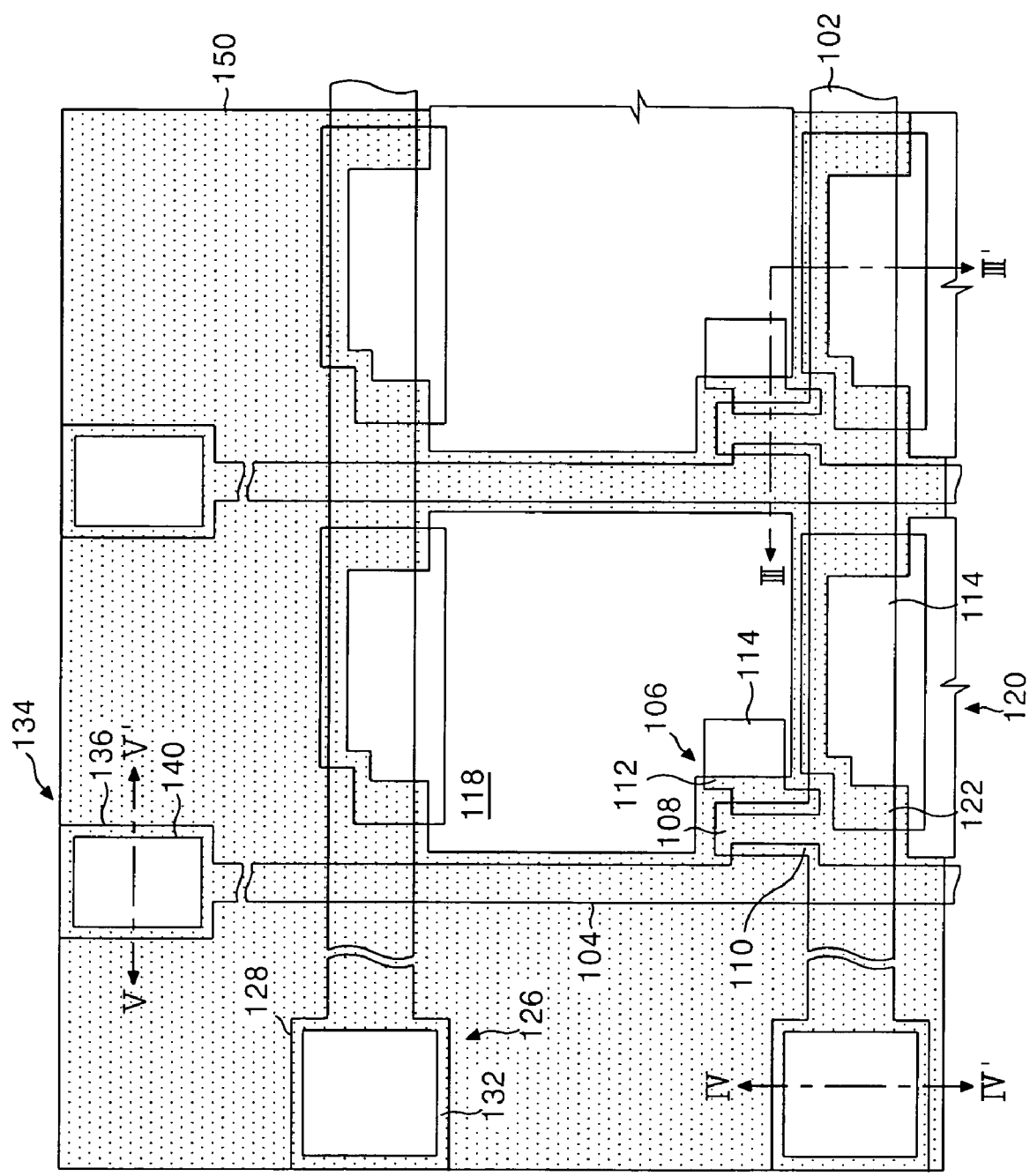

FIGS. 11A and 11B illustrate plan and sectional views generally describing a third mask process in the method of fabricating the TFT substrate according to the principles of the present invention.

Referring to FIGS. 11A and 11B, the patterned protective film 150, the gate insulating pattern 144, the aforementioned transparent conductive pattern, and the upper data pad electrode 140 may be formed in a third mask process. According to principles of the present invention, the transparent conductive pattern directly contacts the patterned protective film 150, but does not overlap an upper surface thereof.

FIGS. 12A to 12D illustrate sectional views specifically describing the third mask process in the method of fabricating the TFT substrate according to the principles of the present invention.

Referring to FIG. 12A, a protective film layer 150A may be formed over the entire surface of the gate insulating film 144A and on the data metal pattern. In one aspect of the present invention, the protective film layer 150A may for example, include an inorganic insulating material such as silicon nitride (SiNx), silicon oxide (SiOx), or the like, or combinations thereof, an organic insulating material such as acrylic organic compound having a small dielectric constant, BCB (benzocyclobutene), or PFCB (perfluorocyclobutane), or the like, or combinations thereof.

A second photo-resist film may then be formed over the entire surface of the protective film layer 150A and may be photolithographically patterned using a third mask pattern. For example, the third mask pattern may include a mask substrate formed of a suitably transparent material and a plurality of shielding areas spaced apart by a plurality of exposure areas. Subsequently, the second photo-resist film may, via the third mask pattern, be selectively exposed to light through the exposure areas and be developed, thereby creating a second photo-resist pattern 152. According to principles of the present invention, the second photo-resist pattern 152 exposes portions of the substrate within the pixel area and outside the pixel area. Thus, a portion of the protective film layer 150A between the drain electrode 112 and over a portion of the pre-stage gate line 102 may be exposed by the second photo-resist pattern 152.

Figure 12B:
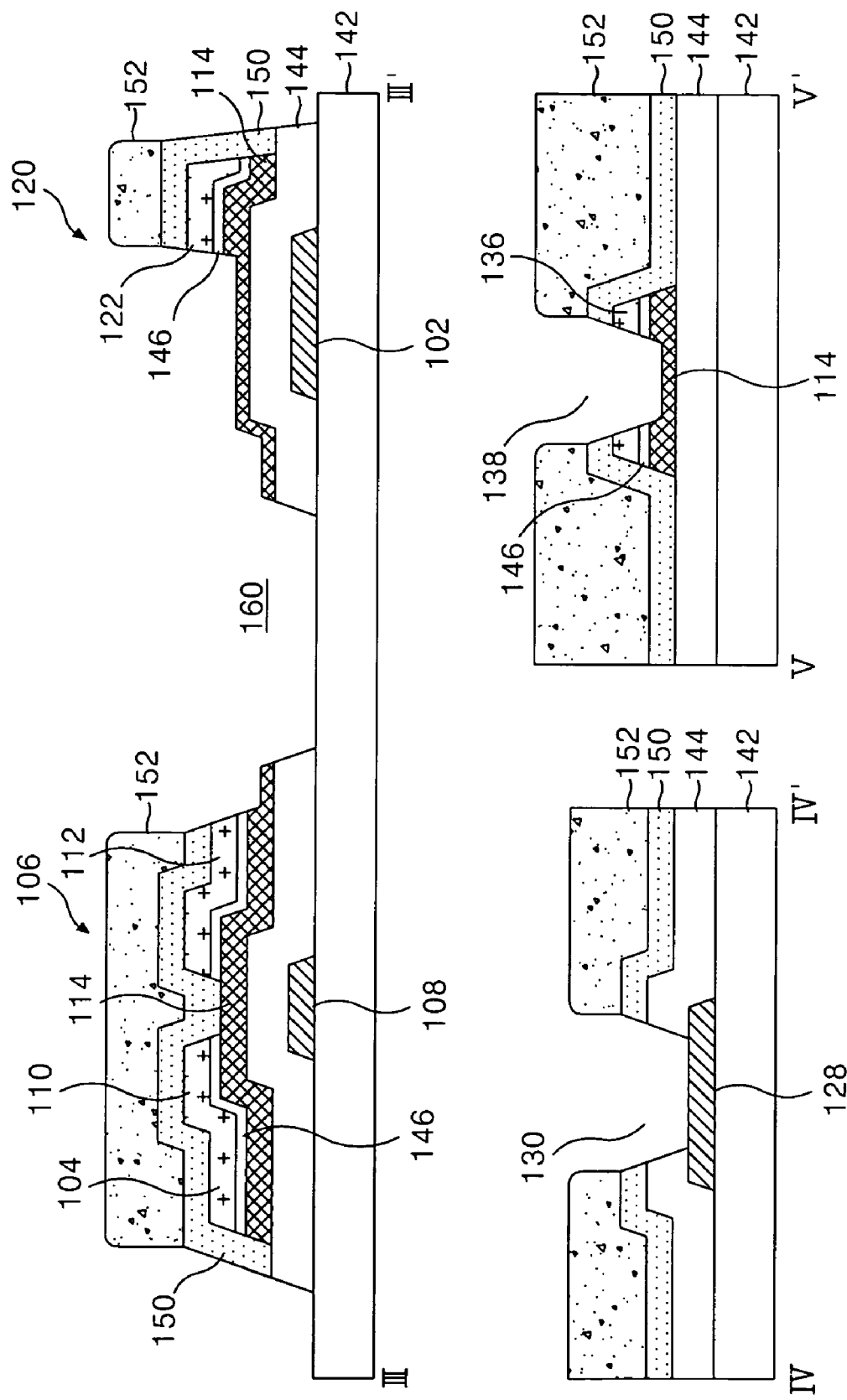

Referring to FIG. 12B, portions of the protective film layer 150A and the gate insulating film 144A exposed by the second photo-resist pattern 152 may be removed (i.e., patterned) in a dry etching process using the second photo-resist pattern 152 as a mask. In one aspect of the present invention, portions of the data metal layer (e.g., the drain electrode 112, the second upper storage electrode 122, and the upper data pad electrode 136), in addition to the ohmic contact layer 146 and the active layer 114, may also be removed (i.e., patterned) in the dry etching process.

Thus, as a result of the dry etching, the patterned protective film 150, the gate insulating pattern 144, and the pixel and first and second contact holes 160, 130, and 138, respectively, may be formed. In one aspect of the present invention, the active layer 114 may be partially etched such that upper and side surfaces of the active layer 114 are exposed within the pixel and second contact holes 160 and 138, respectively, as a result of the patterning. In another aspect of the present invention, the active layer 114 may be completely etched such that upper and surfaces of the gate insulating pattern 144 are exposed within the pixel and second contact holes 160 and 138, respectively, as a result of the patterning.

Still referring to FIG. 12B, the pixel hole 160 may be defined within a pixel area where the pixel electrode 118 is to be eventually formed. In one aspect of the present invention, the pixel hole 160 may expose the substrate 142 and a side surface of the drain electrode 112. In another aspect of the present invention, the pixel hole 160 may extend from the drain electrode 112 to a region over the pre-stage gate line 102 to expose a side surface of the second upper storage electrode 122. In another aspect of the present invention, the pixel electrode 118 may directly contact the protective film pattern 150 within the pixel hole 160.

The first contact hole 130 may be defined at the gate pad portion 126 (i.e., where the upper gate pad electrode 132 is to be formed) and may expose the lower gate pad electrode 128.

The second contact hole 138 may be defined at the data pad portion 134 (i.e., where the upper data pad electrode 140 is to be formed) and may be formed through the lower data pad electrode 136, the ohmic contact layer 146, and the active layer 114 under the lower data pad electrode 136 to expose a portion of the active layer 114. In one aspect of the present invention, the second contact hole 138 may extend into at least a portion of the active layer 114. In another aspect of the present invention, the second contact hole 138 may extend entirely through the active layer 114 and expose a portion of the gate insulating layer 144.

Figure 12C:
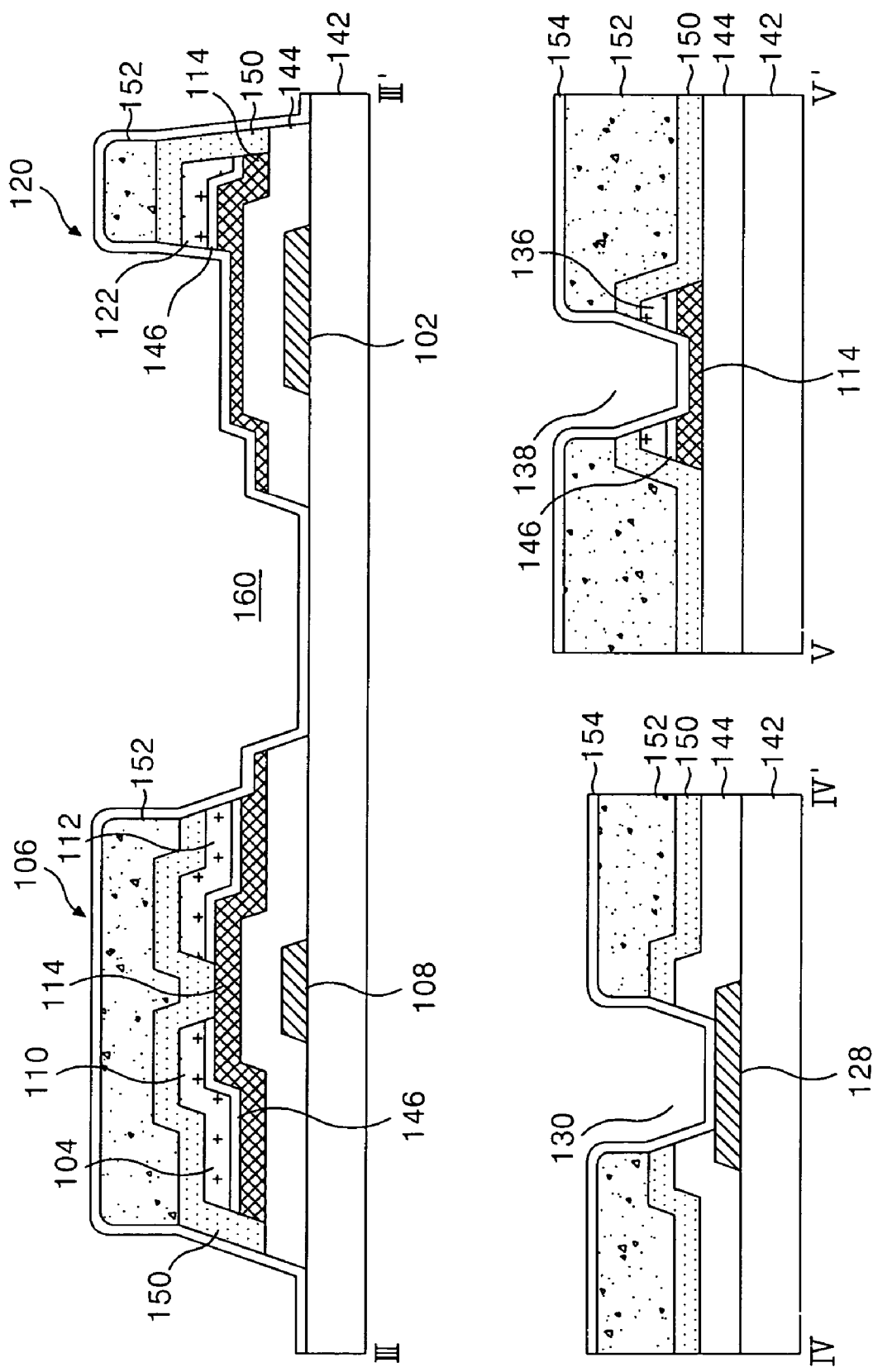

Referring to FIG. 12C, a transparent conductive material 154 may be formed over the TFT substrate and over the second photo-resist pattern 152. In one aspect of the present invention, the transparent conductive material 154 may be formed according to a deposition technique such as the sputtering, or the like. In another aspect of the present invention, the transparent conductive material 154 may, for example, include indium-tin-oxide (ITO), tin-oxide (TO), indium-zinc-oxide (IZO), $S_nO_2$, or the like, or combinations thereof.

Figure 12D:
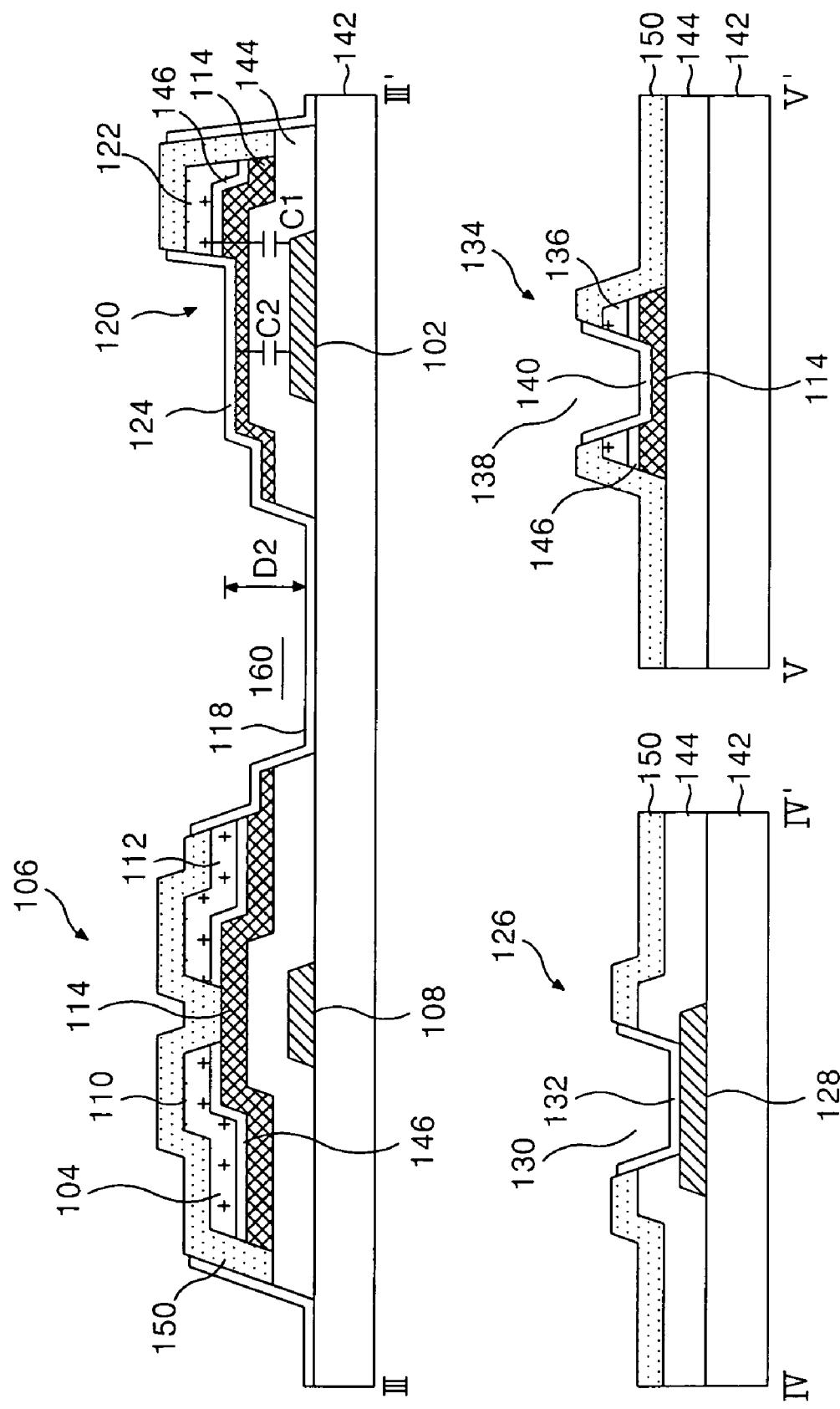

Referring to FIG. 12D, the second photo-resist pattern 152 and portions of the transparent conductive material 154 formed thereon may be simultaneously removed in a lift-off process, thereby forming a transparent conductive pattern including pixel electrode 118, the second upper storage electrode 124, the upper gate pad electrode 132, and the upper data pad electrode 140. Accordingly, the transparent conductive pattern directly contacts the patterned protective film 150 within their respective holes but do not overlap any upper surface portion thereof.

For example, the pixel electrode 118 may directly contact the side surface of the drain electrode 112. The second upper storage electrode 124 may extend from the pixel electrode 118 toward the pre-stage gate line 102 and directly contact a side surface of the first upper storage electrode 122. Accordingly, the second upper storage electrode 124 may contact only the gate insulating film 144 or may contact the gate insulating film 144 and a portion of the active layer 114 to reduce the elevational difference with respect to the pixel electrode 118. The upper gate pad electrode 132 may directly contact the lower gate pad electrode 128 through the first contact hole 130. The upper data pad electrode 132 may directly contact a side surface of the lower data pad electrode 136 through the second contact hole 138.

As described above, the principles of the present invention incorporate a lift-off process to simplify a process of fabricating a TFT substrate, thereby reducing the manufacturing cost and improving the production yield of the TFT substrate.

Secondly, the elevational difference between the second upper storage electrode 124 and the pixel electrode 118 within the pixel hole 160 may be minimized, to substantially prevent alignment defects, and their attendant light leakage problems, from occurring.

Lastly, the storage capacitor of the present invention includes first and second storage capacitors connected in parallel to each other, wherein a distance between electrodes within the first and second storage capacitor is different to increase the overall capacitance of the storage capacitor and stably maintain signals charged in the pixel electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor (TFT) substrate for a display device, comprising:
    a gate line;
    a data line crossing the gate line to define a pixel area;
    a gate insulating film between the gate and data lines;
    a TFT at the crossing of the gate and data lines, the TFT including a gate electrode connected to the gate line, a source electrode connected to the data line, a drain electrode opposed to the source electrode, a semiconductor layer between the gate electrode and the source and drain electrodes, and a channel region between the source and drain electrodes;
    a protective film over the gate line, the data line, and the TFT;

a pixel hole defined within the protective film and the gate insulating film, the pixel hole arranged within the pixel area and outside the pixel area;

a pixel electrode within the portion of the pixel hole arranged within the pixel area and contacting a side surface of the drain electrode;

a first storage capacitor, the first storage capacitor including:
- a first portion of the gate line;
- a first upper storage electrode over the first portion of the gate line; and
- the gate insulating film and the semiconductor layer between the first portion of the gate line and the first upper storage electrode; and a second storage capacitor, the second storage capacitor including:
- a second portion of the gate line;
- a second upper storage electrode over the second portion of the gate line, wherein the second upper storage electrode contacts a side surface of the first upper storage electrode; and
- the gate insulating film between the second portion of the gate line and the second upper storage electrode.

2. The thin film transistor substrate as claimed in claim 1, wherein the pixel electrode and the second upper storage electrode directly contact the protective film.

3. The thin film transistor substrate as claimed in claim 2, wherein the semiconductor layer includes:
- an active layer; and
- an ohmic contact layer on the active layer outside the channel region,
- wherein the active layer is between the second upper storage electrode and the gate insulating film.

4. The thin film transistor substrate as claimed in claim 1, further comprising:
- a lower gate pad electrode extending from the gate line;
- a first contact hole through the protective film and the gate insulating film, wherein the lower gate pad electrode is exposed by the first contact hole; and
- a gate pad portion directly contacting the protective film within the first contact hole, the gate pad portion including an upper gate pad electrode contacting the lower gate pad electrode within the first contact hole.

5. The thin film transistor substrate as claimed in claim 4, further comprising:
- a lower data pad electrode extending from the data line;
- a second contact hole through the protective film and the lower data pad electrode; and
- a data pad portion directly contacting the protective film within the second contact hole, the data pad portion including an upper data pad electrode contacting a side surface of the lower data pad electrode within the second contact hole.

6. The thin film transistor substrate as claimed in claim 5, wherein the data pad portion includes:
- an ohmic contact layer; and
- an active layer provided between the lower data pad electrode and the gate insulating film,
- wherein the second contact hole extends through the ohmic contact layer and at least partially through the active layer.

7. The thin film transistor substrate as claimed in claim 6, wherein the second contact hole extends through the active layer and exposes the gate insulating film.

* * * * *